(12) United States Patent
Wu et al.

(10) Patent No.: US 11,205,682 B2
(45) Date of Patent: Dec. 21, 2021

(54) MEMORY DEVICES

(71) Applicant: SAMSUNG ELECTRONICS CO., LTD., Suwon-Si (KR)

(72) Inventors: Zhe Wu, Seoul (KR); Ja-bin Lee, Hwaseong-si (KR); Jin-woo Lee, Seoul (KR); Kyu-bong Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/446,812

(22) Filed: Jun. 20, 2019

(65) Prior Publication Data
US 2020/0075675 A1 Mar. 5, 2020

(30) Foreign Application Priority Data

Sep. 3, 2018 (KR) .......................... 10-2018-0104737

(51) Int. Cl.
*H01L 45/00* (2006.01)
*H01L 27/24* (2006.01)

(52) U.S. Cl.
CPC .......... *H01L 27/2463* (2013.01); *H01L 45/06* (2013.01); *H01L 45/1233* (2013.01); *H01L 45/144* (2013.01)

(58) Field of Classification Search
CPC ............. H01L 27/2463; H01L 45/1233; H01L 45/144; H01L 45/06; H01L 45/143; H01L 45/126; H01L 45/1253; H01L 27/2436; H01L 27/24; H01L 45/1658; H01L 27/2427; H01L 45/1246; H01L 45/1675; H01L 45/1641; H01L 45/141; H01L 27/1025; H01L 27/10805; H01L 27/10847; H01L 27/10894; H01L 27/11582; H01L 27/2454; H01L 27/2481; H01L 27/11206;
(Continued)

(56) References Cited

U.S. PATENT DOCUMENTS 7,151,273 B2 12/2006 Campbell et al.
10,454,025 B1 * 10/2019 Cheng ................. H01L 45/1233
(Continued)

FOREIGN PATENT DOCUMENTS

JP          5694384      2/2015
KR       10-1360997      2/2014
(Continued)

*Primary Examiner* — Samuel Park
(74) *Attorney, Agent, or Firm* — F. Chau & Associates, LLC

(57) ABSTRACT

A memory device includes first conductive lines extending in a first direction, second conductive lines extending in a second direction, and a plurality of memory cells each arranged between the first and second conductive lines and each including a variable resistance memory layer and a switch material pattern. The switch material pattern includes an element injection area arranged in an outer area of the switch material pattern, and an internal area covered by the element injection area. The internal area contains a first content of at least one element from arsenic (As), sulfur (S), selenium (Se), and tellurium (Te), the element injection area contains a second content of the at least one element from As, S, Se, and Te, and the second content has a profile in which a content of the at least one element decreases away from the at least one surface of the switch material pattern.

14 Claims, 33 Drawing Sheets

(58) Field of Classification Search
CPC ........... H01L 27/11558; H01L 21/8229; H01L 21/8239; H01L 27/1023; H01L 27/1024; H01L 27/1026; H01L 27/1052; H01L 27/108; H01L 27/11; H01L 27/112; H01L 27/11293; H01L 27/11502; H01L 27/11521; H01L 27/11529; H01L 27/11568; H01L 27/1159; H01L 29/685; H01L 2924/14335; H01L 27/792; H01L 29/8615; H01L 45/04; H01L 2924/13089; H01L 27/10844; H01L 27/115; G11C 11/40

See application file for complete search history.

(56) References Cited

U.S. PATENT DOCUMENTS

| | | | |
|---|---|---|---|
| 2007/0097739 | A1* | 5/2007 | Happ .................. H01L 45/1608 365/163 |
| 2010/0182825 | A1* | 7/2010 | Lowrey ............... G11C 13/0004 365/163 |
| 2011/0284134 | A1 | 11/2011 | Nichols et al. |
| 2013/0025532 | A1 | 1/2013 | Leidholm et al. |
| 2013/0029479 | A1 | 1/2013 | Jost et al. |
| 2014/0034892 | A1* | 2/2014 | Erbetta ................... H01L 45/06 257/2 |
| 2017/0244026 | A1* | 8/2017 | Wu ........................ H01L 45/126 |
| 2017/0364306 | A1 | 12/2017 | Kim |
| 2018/0047899 | A1 | 2/2018 | Horii et al. |
| 2019/0252612 | A1* | 8/2019 | Tortorelli ............. H01L 45/1233 |

FOREIGN PATENT DOCUMENTS

| | | |
|---|---|---|
| KR | 10-2017-0142341 | 12/2017 |
| KR | 10-2018-0017850 | 2/2018 |

* cited by examiner

A1-A1'

A1-A1'

A1-A1'

A1-A1'

A1-A1'

A1-A1'

A1-A1'

A1-A1'

A1-A1'

A1-A1'

A1-A1'

A1-A1'

A1-A1'

MEMORY DEVICES

CROSS-REFERENCE TO RELATED APPLICATION

This application claims the benefit under 35 U.S.C. § 119 of Korean Patent Application No. 10-2018-0104737, filed on Sep. 3, 2018, in the Korean Intellectual Property Office, the disclosure of which is incorporated by reference herein in its entirety.

TECHNICAL FIELD

The present inventive concept relates to a memory device, and more particularly, to a memory device having a cross point array structure.

DISCUSSION OF RELATED ART

The continuing trend towards miniaturization to produce light, thin, and small electronic products has led to an increase in demand for highly integrated memory devices. A memory device having a three-dimensional cross point structure, which may potentially consume very little semiconductor real estate, has been proposed, in which a memory cell is arranged at a cross point between two crossing conductive lines (e.g., a word line and a bit line). An ovonic threshold switching material used as a selection device for the memory device having the cross point structure may have relatively poor thermal stability and chemical stability, and thus, it may be easily damaged in a process of manufacturing the memory device, thereby causing degradation of its electrical characteristics.

SUMMARY

The present inventive concept provides a memory device formed by a method of manufacturing the memory device, whereby degradation of electrical characteristics of an ovonic threshold switching material may be prevented.

According to an aspect of the present inventive concept, there is provided a memory device including a plurality of first conductive lines extending on a substrate in a first direction that is parallel with an upper surface of the substrate, a plurality of second conductive lines extending over the plurality of first conductive lines in a second direction that is parallel with the upper surface of the substrate, and a plurality of memory cells arranged between the plurality of first conductive lines and the plurality of second conductive lines and each including a variable resistance memory layer and a switch material pattern, in which the switch material pattern includes an element injection area arranged in an outer area of the switch material pattern, the outer area of the switch material pattern having an element injection distance from at least one surface of the switch material pattern, and an internal area covered by the element injection area, in which the internal area contains a first content of at least one element from among arsenic (As), sulfur (S), selenium (Se), and tellurium (Te), the element injection area contains a second content of the at least one element from among As, S, Se, and Te, and the second content has a profile in which a content of the at least one element decreases away from the at least one surface of the switch material pattern.

According to another aspect of the present inventive concept, there is provided a memory device including a plurality of first conductive lines extending on a substrate in a first direction that is parallel with an upper surface of the substrate, a plurality of second conductive lines extending over the plurality of first conductive lines in a second direction that is parallel with the upper surface of the substrate, and a plurality of memory cells each arranged in an area in which one of the plurality of first conductive lines and one of the plurality of second conductive lines overlaps each other, between the plurality of first conductive lines and the plurality of second conductive lines, with each of the plurality of memory cells including a variable resistance memory layer and a switch material pattern, in which the switch material pattern includes an internal area containing a first content of at least one element from among arsenic (As), sulfur (S), selenium (Se), and tellurium (Te), and an element injection area surrounding a side wall of the internal area and containing a second content of the at least one element from among As, S, Se, and Te, the second content being lower than the first content, in which the second content has a profile in which a content of the at least one element decreases away from a side wall of the switch material pattern.

According to another aspect of the present inventive concept, there is provided a memory device including a plurality of first conductive lines extending on a substrate in a first direction that is parallel with an upper surface of the substrate, a plurality of second conductive lines extending over the plurality of first conductive lines in a second direction that is parallel with the upper surface of the substrate, and a plurality of memory cells each arranged in an area in which one of the plurality of first conductive lines and one of the plurality of second conductive lines overlaps each other, between the plurality of first conductive lines and the plurality of second conductive lines, with each of the plurality of memory cells including a variable resistance memory layer, a first interface layer, a switch material pattern, a second interface layer, and an upper electrode, in which the switch material pattern includes an element injection area arranged in an outer area of the switch material pattern, the outer area of the switch material pattern having an element injection distance from at least one surface of the switch material pattern, and an internal area covered by the element injection area, in which the internal area contains a first content of at least one element from among arsenic (As), sulfur (S), selenium (Se), and tellurium (Te), the element injection area contains a second content of the at least one element from among As, S, Se, and Te, the second content has a profile in which a content of the at least one element decreases away from the at least one surface of the switch material pattern, and side walls of the first interface layer, the switch material pattern, the second interface layer, and the upper electrode are collinearly aligned.

BRIEF DESCRIPTION OF THE DRAWINGS

Example embodiments of the present inventive concept will be more clearly understood from the following detailed description taken in conjunction with the accompanying drawings, in which.

Figure 1:
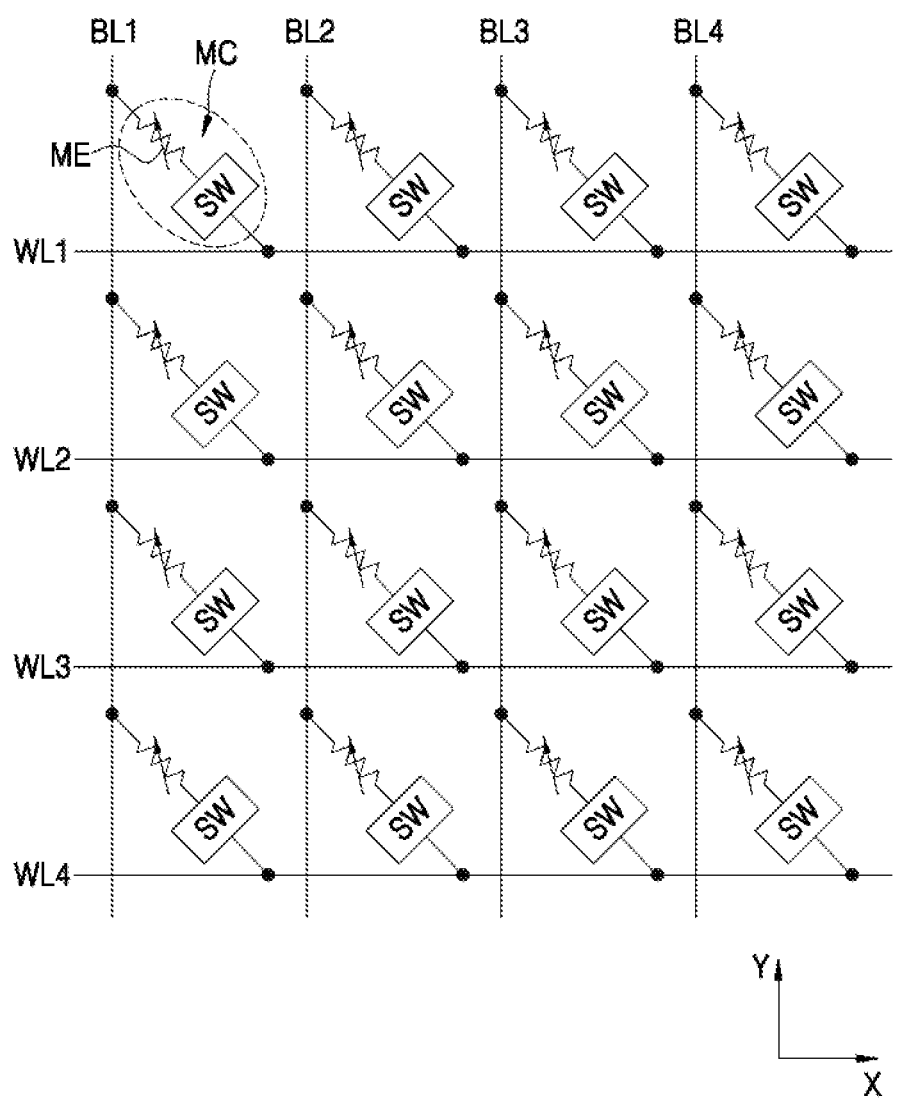
FIG. 1 is an equivalent circuit diagram of a memory device according to an example embodiment of the present inventive concept.

Since the drawings in FIGS. 1-18F are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described in detail by referring to the accompanying drawings.

FIG. 1 is an equivalent circuit diagram of a memory device 10 according to an example embodiment of the present inventive concept.

Referring to FIG. 1, the memory device 10 may include a plurality of word lines WL1, WL2, WL3, and WL4 extending in a first direction (that is, an X direction of FIG. 1) and a plurality of bit lines BL1, BL2, BL3, and BL4 extending in a second direction (that is, a Y direction of FIG. 1) perpendicular to the first direction. The plurality of word lines WL1, WL2, WL3, and WL4 may be spaced apart from each other in the second direction (the Y direction), and the plurality of bit lines BL1, BL2, BL3, and BL4 may be spaced apart from each other in the first direction (the X direction). A plurality of memory cells MC may each be connected to corresponding ones of the plurality of word lines WL1, WL2, WL3, and WL4 and the plurality of bit lines BL1, BL2, BL3, and BL4, respectively. The memory cells MC may be disposed at intersections between the bit lines BL1, BL2, BL3, and BL4 and the word lines WL1, WL2, WL3, and WL4. Each of the plurality of memory cells MC may include a variable resistance material layer ME for storing information and a switching device SW for selecting a memory cell. Here, the switching device SW may also be referred to as a selection device or an accessor device.

A voltage may be applied to the variable resistance material layer ME of the memory cell MC through the plurality of word lines WL1, WL2, WL3, and WL4 and the plurality of bit lines BL1, BL2, BL3, and BL4, so that a current may flow in the variable resistance material layer ME. For example, the variable resistance material layer ME may include a phase change material layer which may be reversibly transitioned between a first state and a second state. However, the present inventive concept is not limited thereto. For example, the variable resistance material layer ME may include any variable resistors having a resistance varying depending on an applied voltage. For example, the resistance of the variable resistance material layer ME may be reversibly transitioned between the first state and the second state, depending on the voltage applied to the variable resistance material layer ME of the selected memory cell MC. For other variable resistors, the variable resistance material layer ME may include other materials besides a phase change material such as, for example, a perovskite-based material, a transition metal oxide, or a ferromagnetic material.

According to a change in resistance of the variable resistance material layer ME, the memory cell MC may record digital information, such as "0" or "1", and may erase the digital information from the memory cell MC. For example, the memory cell MC may record data as "0" indicating a high resistance state and "1" indicating a low resistance state. However, the present inventive concept is not limited thereto. For example, in an example embodiment of the present inventive concept, various resistance states besides "0" indicating a high resistance state and "1" indicating a low resistance state may be recorded by the memory cell MC.

An arbitrary memory cell MC may be addressed based on selection of the plurality of word lines WL1, WL2, WL3, and WL4 and the plurality of bit lines BL1, BL2, BL3, and BL4, and a certain signal may be applied between the plurality of word lines WL1, WL2, WL3, and WL4 and the plurality of bit lines BL1, BL2, BL3, and BL4 to program the memory cell MC. Then, values of currents flowing through the plurality of bit lines BL1, BL2, BL3, and BL4 may be measured to read information according to a resistance of a variable resistor included in the corresponding memory cell MC.

Figure 2:
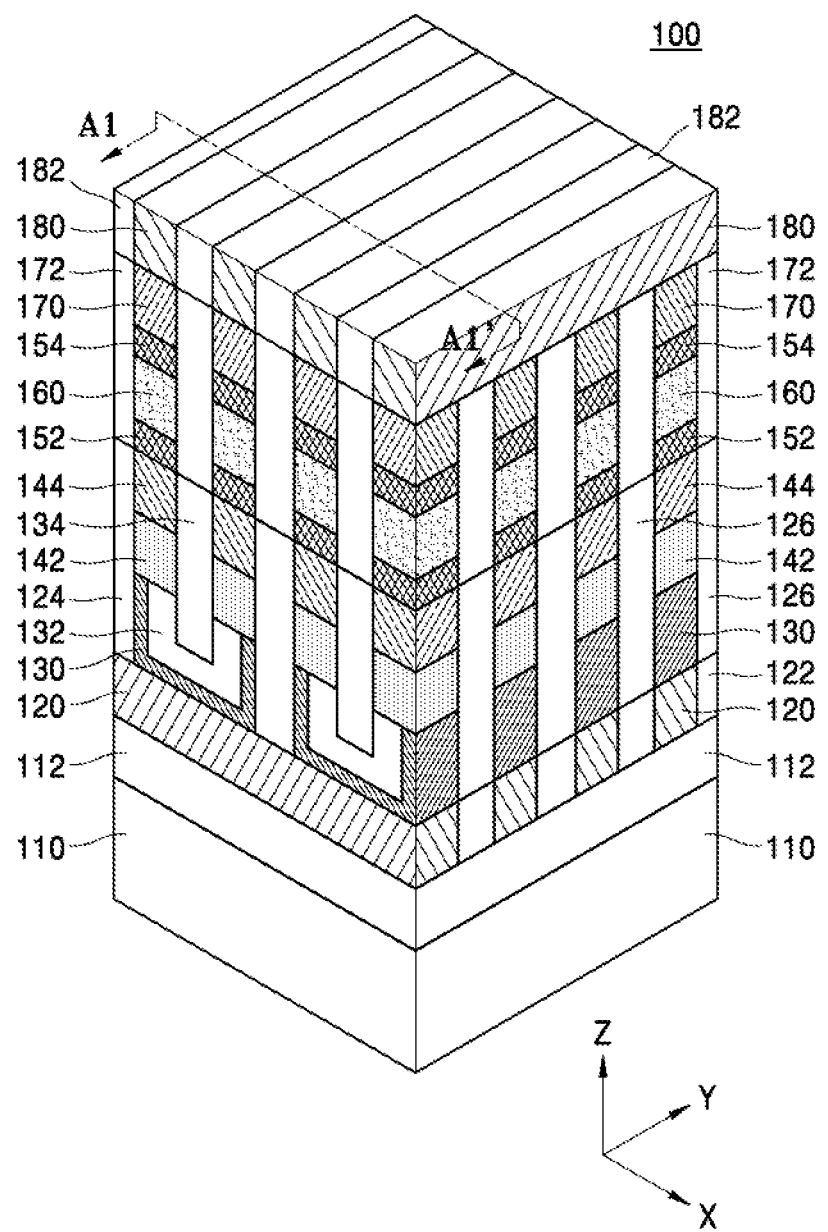
FIG. 2 is a perspective view of a memory device according to an example embodiment of the present inventive concept.
Figure 3:
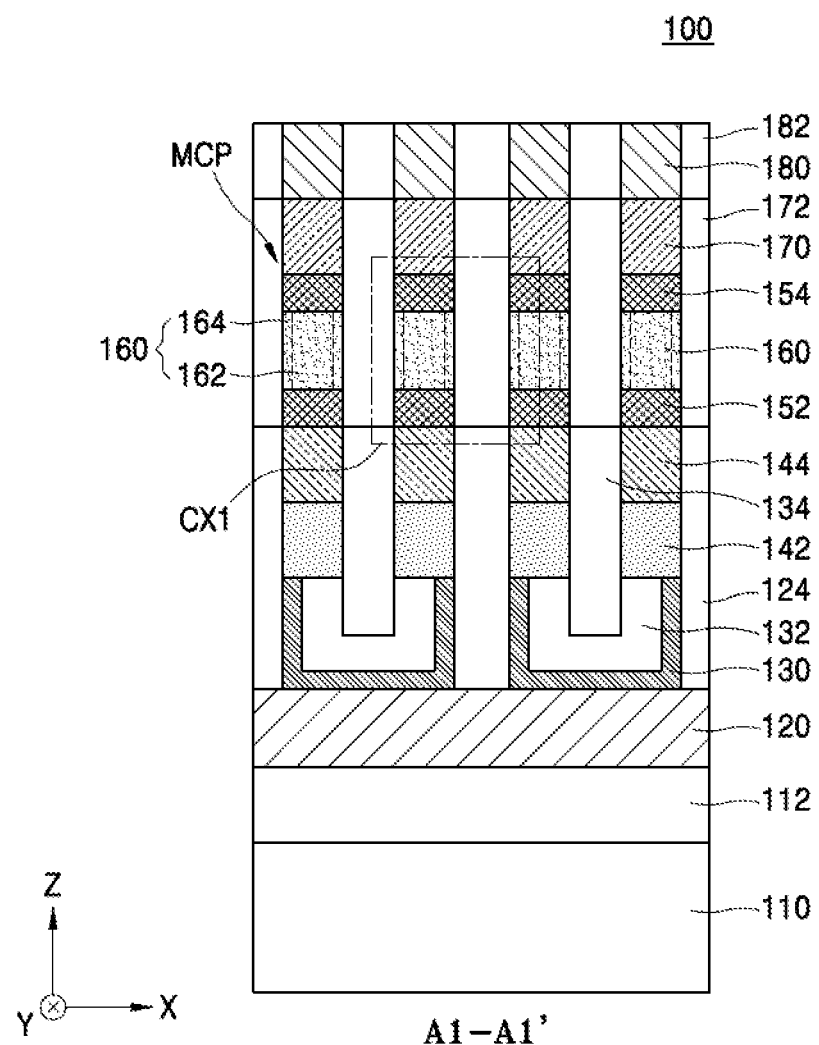
FIG. 3 is a cross-sectional view taken along line A1-A1' of FIG. 2.
Figure 4:
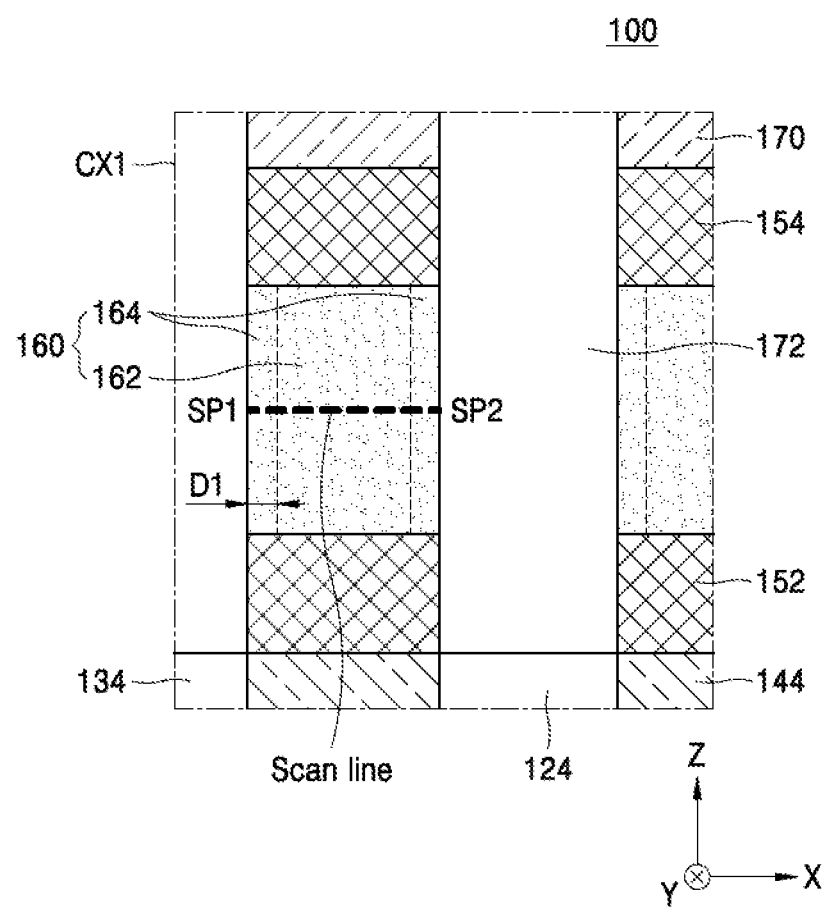
FIG. 4 is an enlarged view of area CX1 of FIG. 3.
Figure 5:
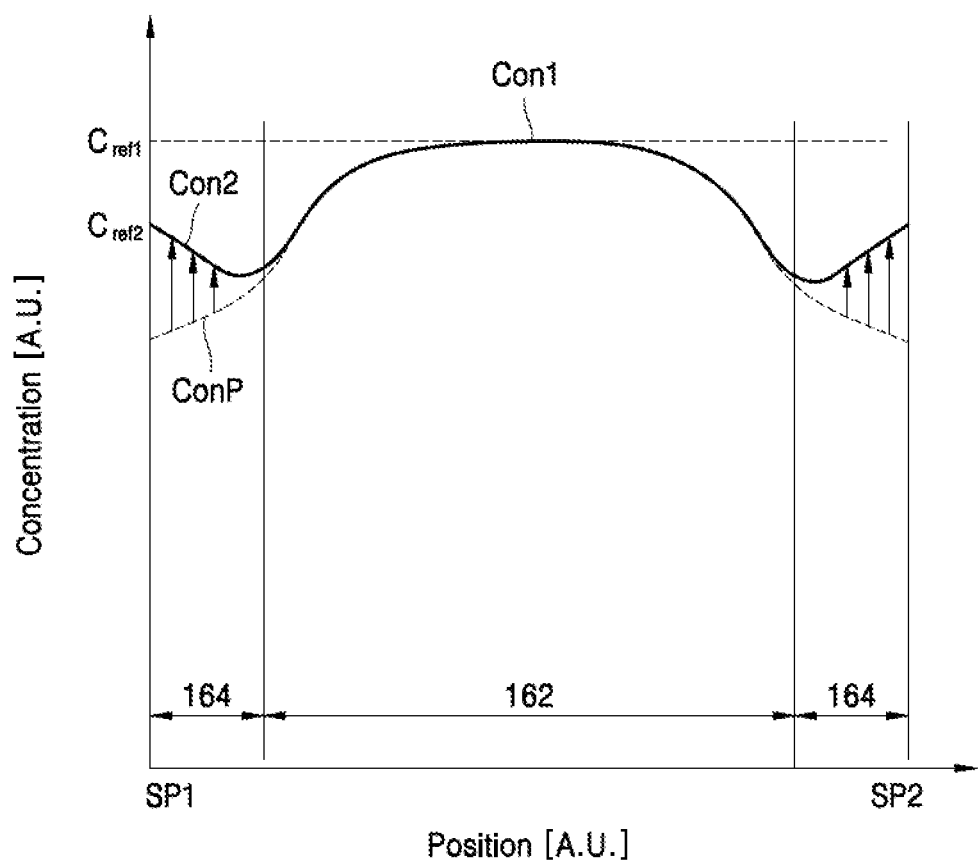
FIG. 5 is a graph showing a schematic content of an element along a scan line area of FIG. 4.

FIG. 2 is a perspective view of a memory device 100 according to an example embodiment of the present inventive concept. FIG. 3 is a cross-sectional view taken along line A1-A1' of FIG. 2. FIG. 4 is an enlarged view of area CX1 of FIG. 3. FIG. 5 is a graph showing a schematic content of an element along a scan line area of FIG. 4.

Referring to FIGS. 2 through 5, the memory device 100 may include a plurality of first conductive lines 120, a plurality of second conductive lines 180, and a plurality of memory cells MCP arranged on a substrate 110.

A first interlayer insulating layer 112 may be arranged on the substrate 110, and may include oxide, such as silicon oxide ($SiO_2$), or nitride, such as silicon nitride ($Si_3N_4$).

A plurality of transistors included in a driving circuit for driving the plurality of memory cells MCP may be formed on the substrate 110. For example, the driving circuit may be peripheral circuits capable of processing data input/output to/from the plurality of memory cells MCP, in which the peripheral circuits may include, for example, page buffers, latch circuits, cache circuits, column decoders, sense amplifiers, data in/output circuits, row decoders, etc. For example, the driving circuit may be arranged on the substrate 110 in an area in which the driving circuits vertically overlap the plurality of memory cells MCP, and the first interlayer insulating layer 112 may be arranged on the substrate 110 to cover the driving circuit. For example, the memory device 100 may have a cell-over-peri (COP) structure. That is, the plurality of memory cells MCP may be formed in a cell region over the peripheral circuits in a vertical direction (a Z direction). Alternatively, the driving circuits may be arranged on the substrate 110 in an area in which the driving circuits do not vertically overlap the plurality of memory cells MCP.

The plurality of first conductive lines 120 may extend on the first interlayer insulating layer 112 in a first direction (an X direction) which is parallel with an upper surface of the substrate 110. The plurality of second conductive lines 180 may extend in a second direction (a Y direction), which is parallel with the upper surface of the substrate 110, at a height greater (or at a level higher) than that of the plurality of first conductive lines 120, with respect to an upper surface of the substrate 110. The plurality of second conductive lines 180 may be spaced apart from the plurality of first conductive lines 120 in a third direction (a Z direction) perpendicular to the first and second directions (the X and Y directions). The plurality of first conductive lines 120 may correspond to the plurality of word lines WL1, WL2, WL3, and WL4 (refer to FIG. 1) and the plurality of second conductive lines 180 may correspond to the plurality of bit lines BL1, BL2, BL3, and BL4 (refer to FIG. 1).

Each of the plurality of first conductive lines 120 and the plurality of second conductive lines 180 may include metal, conductive metal nitride, conductive metal oxide, or a combination thereof. For example, each of the plurality of first conductive lines 120 and the plurality of second conductive lines 180 may include, for example, tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. Also, each of the plurality of first conductive lines 120 and the plurality of second conductive lines 180 may include a metal layer and a conductive barrier layer covering at least a portion of the metal layer. The conductive barrier layer may include, for example, titanium (Ti), titanium nitride (TiN), tantalum (Ta), tantalum nitride (TaN), or a combination thereof.

A first insulating layer 122 may be arranged between each adjacent two of the plurality of first conductive lines 120, and a second insulating layer 182 may be arranged between each adjacent two of the plurality of second conductive lines 180. The first insulating layer 122 may have a shape of a plurality of lines extending in the first direction (the X direction) and the second insulating layer 182 may have a shape of a plurality of lines extending in the second direction (the Y direction).

The plurality of memory cells MCP may be arranged between the plurality of first conductive lines 120 and the plurality of second conductive lines 180. Each of the plurality of memory cells MCP may be arranged in an area in which one of the plurality of first conductive lines 120 and one of the plurality of second conductive lines 180 overlap each other in the vertical direction (the Z direction) and each of the plurality of memory cells MCP may be connected to the corresponding first conductive line 120 and the corresponding second conductive line 180. For example, the plurality of memory cells MCP may be disposed at intersections where the plurality of first conductive lines 120 and the plurality of second conductive lines 180 cross each other at right angles.

Each of the plurality of memory cells MCP may include a heating electrode 130, a variable resistance memory layer 142, an intermediate electrode 144, a first interface layer 152, a switch material pattern 160, a second interface layer 154, and an upper electrode 170 sequentially arranged on one of the plurality of first conductive lines 120.

A first insulating pattern 124 may be disposed between two adjacent memory cells MCP in the first direction (the X direction) arranged on the plurality of first conductive lines 120, and a second insulating pattern 126 may be disposed between two adjacent memory cells MPC in the second direction (the Y direction) arranged on the first insulating layer 122. The second insulating pattern 126 may have a shape of a plurality of lines extending in the first direction (the X direction) and spaced apart from each other in the second direction (the Y direction). The first insulating pattern 124 and the second insulating pattern 126 may have upper surfaces at a height the same as that of an upper surface of the intermediate electrode 144. According to an example embodiment of the present inventive concept, unlike the case illustrated in FIG. 2, the first insulating pattern 124 and the second insulating pattern 126 may be formed as one material layer.

The heating electrode 130 may include a conductive material for generating sufficient heat to cause a phase change of the variable resistance memory layer 142. According to an example embodiment of the present inventive concept, the heating electrode 130 may include, for example, titanium nitride (TiN), titanium silicon nitride (TiSiN), titanium aluminium nitride (TiAlN), tantalum silicon nitride (TaSiN), tantalum aluminium nitride (TaAlN), tantalum nitride (TaN), tungsten silicide (WSi), tungsten nitride (WN), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminium nitride (ZrAlN), molybdenum aluminium nitride (MoAlN), titanium aluminium (TiAl), titanium oxynitride (TiON), titanium aluminium oxynitride (TiAlON), tungsten oxynitride (WON), tantalum oxynitride (TaON), carbon (C), silicon carbide (SiC), silicon carbon nitride (SiCN), carbon nitride (CN), titanium carbon nitride (TiCN), tantalum carbon nitride (TaCN), or a combination thereof. The heating electrode 130 may be formed to have a U-shaped cross-section and one heating electrode 130 may be shared by two adjacent memory cells MCP. However, the present inventive concept is not limited thereto. For example, the heating electrode 130 may have various shapes and may not be shared by adjacent memory cells MCP or may be shared by three or more adjacent memory cells MCP.

A third insulating pattern 132 having a U-shaped cross-section may be arranged on an inner wall of the heating electrode 130. Also, a fourth insulating pattern 134 may be arranged on the third insulating pattern 132 between two memory cells MCP sharing one heating electrode 130. The fourth insulating pattern 134 may have an upper surface which is coplanar with the upper surface of the intermediate electrode 144.

The variable resistance memory layer 142 may be arranged on the heating electrode 130 and the third insulating pattern 132, and may include a phase-change material reversibly changing between an amorphous state and a crystalline state according to heating time. For example, the variable resistance memory layer 142 may include a material, the phase of which may be reversibly changed due to Joule heat generated by a voltage applied to both ends of the variable resistance memory layer 142 and the resistance of which may be changed based on the change of the phase. In detail, the phase-change material may become a high resistance state in the amorphous state and may become a low resistance state in the crystalline state. Data may be stored in the variable resistance memory layer 142 such that the high resistance state is defined as "0" and the low resistance state is defined as "1."

In a set operation, the phase-change material of the variable resistance memory layer 142 may switch from the high resistance state (the amorphous state) to the low resistance state (the crystalline state) as a moderate current pulse with longer width is applied to raise the temperature of the material above its crystallization temperature. In a reset operation, the phase-change material of the variable resistance memory layer 142 may switch from the low resistance state (the crystalline state) to the high resistance state (the amorphous state) as a high current pulse with shorter width is applied to raise the temperature of the material above its melting point.

In an example embodiment of the present inventive concept, the variable resistance memory layer 142 may include at least one or a combination of, for example, germanium antimony telluride (GeSbTe, GST), germanium telluride (GeTe), antimony telluride (SbTe), indium selenide (InSe), gallium antimonide (GaSb), indium antimonide (InSb), arsenic telluride (AsTe), aluminium telluride (AlTe), bismuth antimony telluride (BiSbTe, BST), indium antimony telluride (InSbTe, IST), germanium antimony telluride (GeSbTe), tellurium germanium arsenide (TeGeAs), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe), indium germanium telluride (InGeTe), germanium tin telluride (GeSnTe), germanium bismuth telluride (GeBiTe), germanium tellurium selenide (GeTeSe), arsenic antimony telluride (AsSbTe), bismuth tin antimonide (BiSnSb), germanium tellurium oxide (GeTeO), tellurium germanium antimony sulfide (TeGeSbS), tellurium germanium tin oxide (TeGeSnO), tellurium germanium tin gold (TeGeSnAu), palladium tellurium germanium tin (PdTeGeSn), indium selenium titanium cobalt (InSeTiCo), germanium antimony tellurium palladium (GeSbTePd), germanium antimony tellurium cobalt (GeSbTeCo), antimony tellurium bismuth selenium (SbTeBiSe), silver indium antimony tellurium (AgInSbTe), germanium antimony selenium tellurium (GeSbSeTe), germanium tin antimony tellurium (GeSnSbTe), germanium tellurium tin nickel (GeTeSnNi), germanium tellurium tin palladium (GeTeSnPd), germanium tellurium tin platinum (GeTeSnPt), indium tin antimony tellurium (InSnSbTe), and arsenic germanium antimony tellurium (AsGeSbTe).

In an example embodiment of the present inventive concept, the variable resistance memory layer 142 may further include an impurity of at least one of, for example, carbon (C), nitrogen (N), silicon (Si), oxygen (O), phosphorous (P), bismuth (Bi), and tin (Sn). In an example embodiment of the present inventive concept, the variable resistance memory layer 142 may further include a metal material of at least one of, for example, aluminium (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), lead (Pb), and polonium (Po).

In an example embodiment of the present inventive concept, the variable resistance memory layer 142 may have a multi-layered structure in which at least two layers having different properties are stacked, and a barrier layer may further be formed between the at least two layers to prevent distribution of materials between the at least two layers. Also, the variable resistance memory layer 142 may have a super-lattice structure in which a plurality of layers including different materials are alternately and repeatedly stacked. For example, the variable resistance memory layer 142 may include a structure in which a first layer including GeTe and a second layer including SbTe are alternately and repeatedly stacked. However, the present inventive concept is not limited thereto. For example, each of the first layer and the second layer may include various materials described above.

It is described that the variable resistance memory layer 142 includes, for example, the phase change material. However, the present inventive concept is not limited thereto. For example, the variable resistance memory layer 142 of the memory device 100 may include various materials having a resistance-changing characteristic.

In an example embodiment of the present inventive concept, when the variable resistance memory layer 142 includes a transition metal oxide, the memory device 100 may be a resistance random access memory (ReRAM). When the variable resistance memory layer 142 includes a transition metal oxide, at least one electrical path may be generated in or erased from the variable resistance memory layer 142, based on a program operation. When the electrical path is generated, the variable resistance memory layer 142 may have a low resistance and when the electrical path is removed or disappears, the variable resistance memory layer 142 may have a high resistance. The memory device 100 may store data by using the difference between resistances of the variable resistance memory layer 142.

When the variable resistance memory layer 142 includes a transition metal oxide, the transition metal oxide may include at least one metal selected from, for example, tantalum (Ta), zirconium (Zr), titanium (Ti), hafnium (Hf), manganese (Mn), yttrium (Y), nickel (Ni), cobalt (Co), zinc (Zn), niobium (Nb), copper (Cu), iron (Fe), and chromium (Cr). For example, the transition metal oxide may include a single layer or multiple layers including at least one material selected from, for example, tantalum oxide ($Ta_2O_{5-x}$), zirconium oxide ($ZrO_{2-x}$), titanium oxide ($TiO_{2-x}$), hafnium oxide ($HfO_{2-x}$), manganese oxide ($MnO_{2-x}$), yttrium oxide ($Y_2O_{3-x}$), nickel oxide ($NiO_{1-y}$), niobium oxide ($Nb_2O_{5-x}$), copper oxide ($CuO_{1-y}$), and iron oxide ($Fe_2O_{3-x}$). With respect to the example materials described above, x and y may be selected within ranges of $0 \leq x \leq 1.5$ and $0 \leq y \leq 0.5$, respectively, but the present inventive concept is not limited thereto.

In an example embodiment of the present inventive concept, when the variable resistance memory layer 142 has a magnetic tunnel junction (MTJ) structure including two electrodes including a magnetic substance and a dielectric substance interposed between the two electrodes including the magnetic substance, the memory device 100 may be a magnetic RAM (MRAM).

The two electrodes may be a magnetization fixed layer (or a pinned layer) and a magnetization free layer, respectively, and the dielectric substance interposed between the two electrodes may be a tunnel barrier layer. The magnetization fixed layer may have a magnetization direction fixed in a direction and the magnetization free layer may have a magnetization direction that may be changed to be parallel or anti-parallel with the magnetization direction of the magnetization fixed layer. The magnetization fixed layer and the magnetization free layer may have the magnetization directions which are parallel with a surface of the tunnel barrier layer, but the present inventive concept is not limited thereto. For example, the magnetization fixed layer and the magnetization free layer may have the magnetization directions that are perpendicular to a surface of the tunnel barrier layer. When the magnetization direction of the magnetization free layer is parallel with the magnetization direction of the magnetization fixed layer, the variable resistance memory layer 142 may have a first resistance. In this case, the first resistance may have a low resistance value and may read data of a state "1". On the contrary, when the magnetization direction of the magnetization free layer is antiparallel with the magnetization direction of the magnetization fixed layer, the variable resistance memory layer 142 may have a second resistance. In this case, the second resistance may have a high resistance value and may read data of a state "0". The memory device 100 may store data by using the difference between the resistances. The magnetization direction of the magnetization free layer may be changed by spin torque of electrons in a program current.

The magnetization fixed layer and the magnetization free layer may include a magnetic material. Here, the magnetization fixed layer may further include an antiferromagnetic material fixing a magnetization direction of a ferromagnetic material in the magnetization fixed layer. The tunnel barrier layer may include an oxide of a metal including any one selected from, for example, magnesium (Mg), titanium (Ti), aluminium (Al), magnesium-zinc (MgZn), and magnesium-boron (MgB), but the present inventive concept is not limited thereto.

The intermediate electrode 144 may be arranged on the variable resistance memory layer 142. According to an example embodiment of the present inventive concept, the intermediate electrode 144 may include, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof.

The first interface layer 152 may be arranged on the intermediate electrode 144, and may be interposed between the switch material pattern 160 and the intermediate electrode 144. The first interface layer 152 may be a material layer for preventing damage that may occur to a switch material pattern 160 due to contact between the switch material pattern 160 and the intermediate electrode 144. The first interface layer 152 may include a conductive material, for example, carbon (C).

The switch material pattern 160 may be arranged on the first interface layer 152, and may be a current adjusting layer for controlling a flow of currents. The switch material pattern 160 may include a material layer having a resistance varying according to an amplitude of a voltage applied to both ends of the switch material pattern 160. For example, the switch material pattern 160 may include a material layer having an ovonic threshold switching (OTS) characteristic. An OTS material may serve as a switching function due to a resistance difference depending on an applied voltage while maintaining an amorphous state. The resistance of the OTS material may vary greatly according to a temperature thereof in the amorphous state. The switch material pattern 160 may include a chalcogenide material, as the OTS material layer. According to an example embodiment of the present inventive concept, the switch material pattern 160 may include, for example, Si, Te, Se, S, As, Ge, In, Sb, or a combination thereof. In addition, the switch material pattern 160 may further include, for example, C, N, O, B, P, or a combination thereof. For example, the switch material pattern 160 may include a chalcogenide material having a chemical formula of $Ge_XAs_YSe_ZSi_U$ ($0<X+Y+Z+U\leq1$).

The switch material pattern 160 may include an internal area 162 and an element injection area 164 covering side walls of the internal area 162. The element injection area 164 may be formed in an area of the switch material pattern 160, in which the area has a first distance D1 from a side wall of the switch material pattern 160 in a first direction (an X direction). For example, a portion of the switch material pattern 160 from the side wall going inward within the first distance D1 may be defined as the element injection area 164. In a planar perspective, the element injection area 164 may cover the entirety of the side walls of the internal area 162 and may have an upper surface at a height the same as that of an upper surface of the internal area 162. Thus, the element injection area 164 may be in the outer area of the switch material pattern 160, and the internal area 162 may be in the inner area of the switch material pattern 160.

The chalcogenide materials of the internal area 162 and the element injection area 164 may have different contents on at least one element. For example, the internal area 162 and the element injection area 164 may include at least one of As, S, Se, and Te, and a first content of the at least one of As, S, Se, and Te included in the internal area 162 may be different from a second content of the at least one of As, S, Se, and Te included in the element injection area 164. The internal area 162, which is in the inner area of the switch material pattern 160, may not be exposed to etching chemicals during a process of patterning the switch material pattern 160. The element injection area 164, which is in the outer area of the switch material pattern 160, may be exposed to the etching chemicals during the process of patterning the switch material pattern 160 so that at least one of As, S, Se, and Te may be lost and re-injected later by a surface treatment process or an ion implantation process.

The term "element injection area" used herein may denote an area, into which at least one element of the chalcogenide material is re-supplied or re-provided from the outside by an additional treatment process. That is, the element injection area 164 may refer to an area, to which at least one element of the chalcogenide material is supplied by, for example, an ion implantation process, a plasma processing treatment process, or any other processes, such as solid-state diffusion process, to compensate for a loss of the at least one element of the chalcogenide material. Accordingly, the first distance D1 may be the penetration or injection distance of the at least one element of the chalcogenide material supplied in the above described process. The first distance D1 may also be referred to as an element injection distance.

According to an example embodiment of the present inventive concept, the internal area 162 may include Ge of about 10 to about 20 at %, As of about 15 to about 40 at %, Se of about 40 to about 60 at %, and Si of about 5 to about 15 at %. A second content of As included in the element injection area 164 may be lower than a first content of As included in the internal area 162, and/or a second content of Se included in the element injection area 164 may be lower than a first content of Se included in the internal area 162.

According to an example embodiment of the present inventive concept, the internal area 162 may include Ge of about 10 to about 20 at %, As of about 15 to about 40 at %, Te of about 40 to about 60 at %, and Si of about 5 to about 15 at %. A second content of As included in the element injection area 164 may be lower than a first content of As included in the internal area 162, and/or a second content of Te included in the element injection area 164 may be lower than a first content of Te included in the internal area 162.

According to an example embodiment of the present inventive concept, the internal area 162 may include Ge of about 5 to about 15 at %, As of about 15 to about 40 at %, Te of about 30 to about 50 at %, S of about 10 to about 30 at %, and Si of about 5 to about 15 at %. A second content of As included in the element injection area 164 may be lower than a first content of As included in the internal area 162, a second content of Te included in the element injection area 164 may be lower than a first content of Te included in the internal area 162, and/or a second content of S included in the element injection area 164 may be lower than a first content of S included in the internal area 162.

According to an example embodiment of the present inventive concept, at least one of As, S, Se, and Te included in the element injection area 164 may have a profile in which a second content of the at least one of As, S, Se, and Te gradually decreases away from a side wall of the switch material pattern 160 (that is, from an outer wall of the element injection area 164 toward an interface between the internal area 162 and the element injection area 164). The content profile of at least one of As, S, Se, and Te will be described again below with reference to FIG. 5.

The second interface layer 154 may be formed on the switch material pattern 160, and the upper electrode 170 may be arranged on the second interface layer 154. The second interface layer 154 may include a conductive material, for example, C. For example, the first interface layer 152 and the second interface layer 154 may include the same conductive material, for example, C. The upper electrode 170 may include, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof.

A filling insulating layer 172 may be arranged to surround side walls of the first interface layer 152, the switch material pattern 160, the second interface layer 154, and the upper electrode 170. A bottom surface of the filling insulating layer 172 may contact upper surfaces of the first, second, and fourth insulating patterns 124, 126, and 134, and an upper surface of the filling insulating layer 172 may be coplanar with an upper surface of the upper electrode 170. The side walls of the first interface layer 152, the switch material pattern 160, the second interface layer 154, and the upper electrode 170 may be aligned on a straight line.

The plurality of second conductive lines 180 may be arranged on the upper electrode 170 and the filling insulating layer 172. The second insulating layer 182 may be formed to fill spaces among the plurality of second conductive lines 180.

The content profile of at least one of As, S, Se, and Te included in the switch material pattern 160 will be described below with reference to FIG. 5.

In FIG. 5, the content profile of at least one element from among As, S, Se, and Te included in the switch material pattern 160 is schematically illustrated, according to a position on a scan line from a first scan point SP1 to a second scan point SP2 of FIG. 4. For example, when the internal area 162 includes Ge of about 10 to about 20 at %, As of about 15 to about 40 at %, Se of about 40 to about 60 at %, and Si of about 5 to about 15 at %, FIG. 5 may correspond to the content profile of As and/or the content profile of Se, in which As and Se is included in the switch material pattern 160. Also, in FIG. 5, a content profile ConP of at least one element from among As, S, Se, and Te included in the switch material pattern 160 after the process of patterning the switch material pattern 160 (that is, before a surface treatment process) is illustrated as dotted lines, for comparison.

The internal area 162 may include As of a first reference content $C_{ref1}$ at a central point thereof and may have a profile in which a first content Con1 of As gradually decreases in an area of the internal area 162, in which the area of the internal area 162 is adjacent to the side wall of the switch material pattern 160 (that is, toward the interface between the internal area 162 and the element injection area 164). As shown in FIG. 5, the first content Con1 gradually decreases toward the interface between the internal area 162 and the element injection area 164 in two side areas of the internal area 162, and that is, the closer the position of the internal area 162 to the interface between the internal area 162 and the element injection area 164 the lower the first content Con1. On the contrary, the element injection area 164 may include As of a second reference content $C_{ref2}$ at an outer wall thereof (or the side wall of the switch material pattern 160) and may have a profile in which a second content Con2 of As gradually decreases away from the side wall of the switch material pattern 160 (that is, away from the outer wall of the element injection area 164 toward the interface between the internal area 162 and the element injection area 164). As shown in FIG. 5, the second content Con2 gradually decreases as the content measured position moves away from the outer side wall of the element injection area 164, and that is, the closer the position of the element injection area 164 to the outer side wall of the element injection area 164 the higher the second content Con2. The profile of Con2 also shows a minimum near the interface between the internal area 162 and the element injection area 164. Thus, in general, the second content Con2 may be lower than the first content Con1. However, the first content Con1 at some portion of the internal area 162 near the interface between the internal area 162 and the element injection area 164 may be lower than the second content Con2 at some portion of the element injection area 164 near the outer side wall (or at the outer side wall, for example, lower than the second reference content $C_{ref2}$). Also, the second reference content $C_{ref2}$ in the element injection area 164 may be lower than the first reference content $C_{ref1}$ in the internal area 162.

The second content Con2 of As in the element injection area 164 may have the profile in which the second content Con2 of As gradually decreases away from the side wall of the switch material pattern 160, and this may be because As ions are injected from the side wall of the switch material pattern 160 by a surface treatment process. For example, areas that are adjacent to the side wall of the switch material pattern 160 may be exposed to etching chemicals during the processing of patterning the switch material pattern 160, and thus may lose at least one element from among As, S, Se, and Te. In this case, the content ConP of As may decrease toward the side wall of the switch material pattern 160 as indicated by the dotted lines of FIG. 5. The As ions may be injected from the side wall of the switch material pattern 160 as an As-containing plasma treatment process is performed on the side wall of the patterned switch material pattern 160, in which the As-containing plasma treatment process uses a source, such as arsine ($AsH_3$), and thus, the second content Con2 of As may be greater than the content ConP of As after the patterning process. Since As-containing plasma treatment process is a surface treatment process which relies on diffusion of As, the second content Con2 of As may be greater on the outer side wall surface area to have the second reference content $C_{ref2}$ of As. The second content Con2 of As may gradually decrease from the second reference content $C_{ref2}$ of As as the content measured position moves away from the outer side wall of the element injection area 164, and the profile of second content Con2 of As may be affected by the As diffusion profile.

An example of the content profile of As in the switch material pattern 160 is described. However, the content profile of at least one of Se, S, and Te in the switch material pattern 160 may be similar to the example, and thus, it will not be described in detail.

Generally, the OTS material layer including the chalcogenide material may have a relatively poor thermal stability and/or chemical stability, and when the OTS material layer is damaged in a manufacturing process of the memory device 100, electrical characteristics and/or the reliability of the memory device 100 may be degraded. In particular, the chalcogenide material including at least one of As, Se, S, and Te may be volatilized or lost due to etching chemicals when the at least one of As, Se, S, and Te is exposed to the etching chemicals in a patterning process. When the at least one element from among As, Se, S, and Te is lost in areas adjacent to the side wall of the switch material pattern 160, electrical characteristics and/or the reliability of the switch material pattern 160 may be degraded, for example, due to an increase in an off current or an increase in a threshold voltage of the switch material pattern 160.

According to the example embodiments described above, since ion implantation of at least one of As, Se, S, and Te is performed on the side wall of the switch material pattern 160 by a plasma treatment process, the loss of the at least one of As, Se, S, and Te may be compensated for. Thus, the memory device 100 may have excellent electrical characteristics and reliability.

Figure 6:
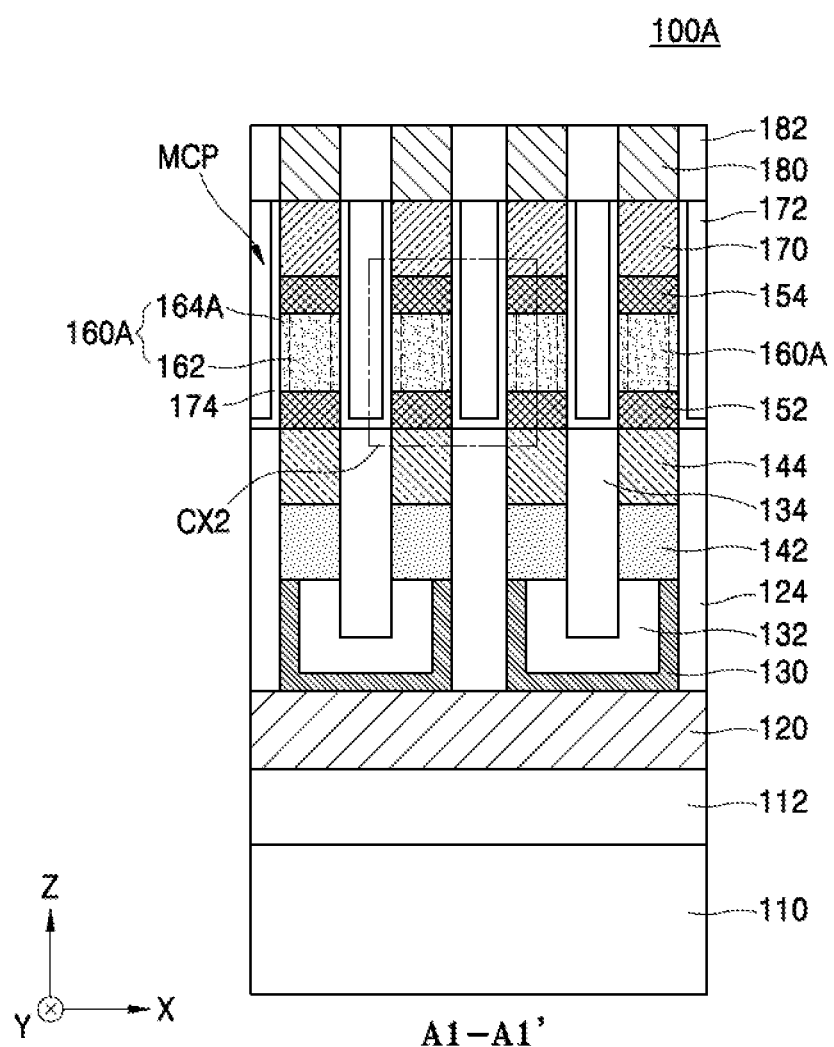
FIG. 6 is a cross-sectional view of a memory device according to an example embodiment of the present inventive concept.
Figure 7:
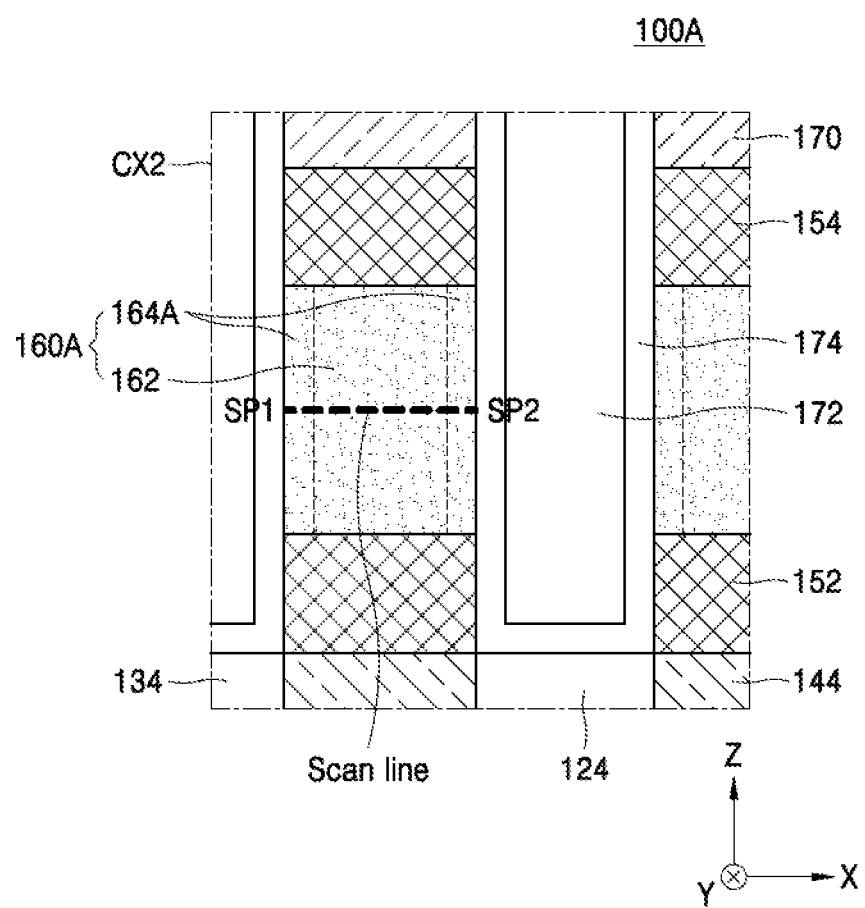
FIG. 7 is an enlarged view of area CX2 of FIG. 6.
Figure 8:
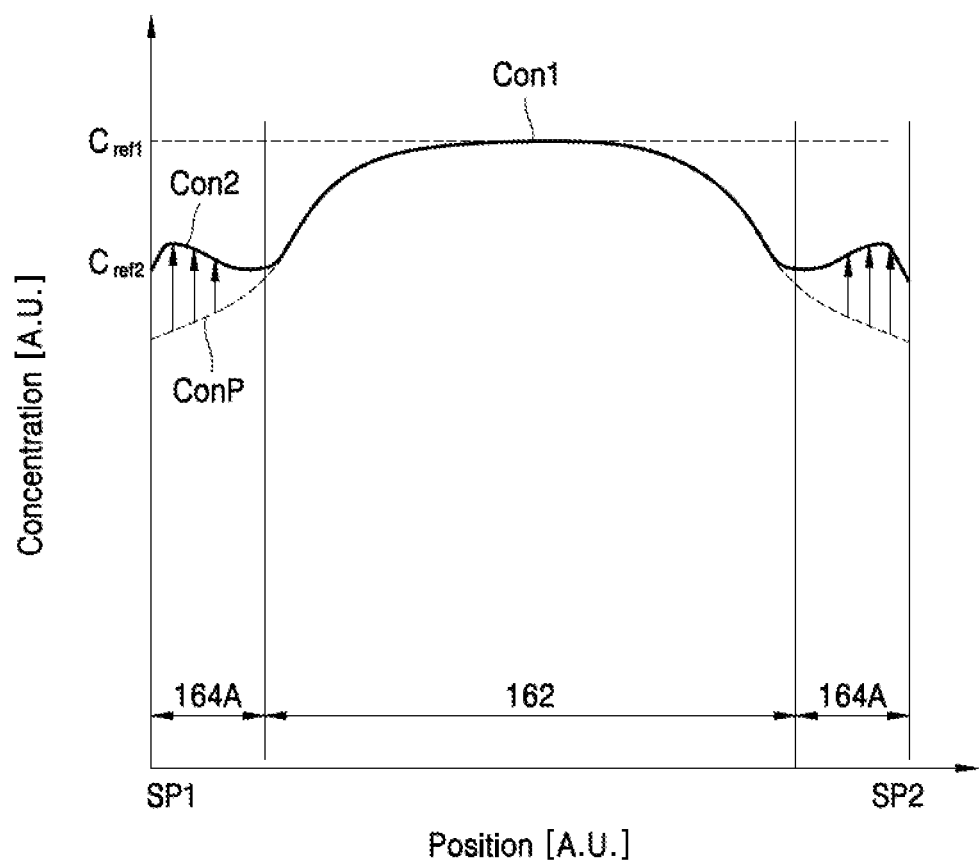
FIG. 8 is a graph showing a schematic content of an element along a scan line area of FIG. 7.

FIG. 6 is a cross-sectional view of a memory device 100A according to an example embodiment of the present inventive concept. FIG. 7 is an enlarged view of area CX2 of FIG. 6. FIG. 8 is a graph showing a schematic content of an element along a scan line of FIG. 7. In FIGS. 6 through 8, the same reference numerals as FIGS. 1 through 5 refer to the same components as FIGS. 1 through 5.

Referring to FIGS. 6 through 8, a switch material pattern 160A may include the internal area 162 and an element injection area 164A, and an insulating spacer 174 may be interposed between the filling insulating layer 172 and side walls of the first interface layer 152, the switch material pattern 160A, the second interface layer 154, and the upper electrode 170. The insulating spacer 174 may contact the element injection area 164A and extend onto the second insulating pattern 126 (refer to FIG. 2) and the fourth insulating pattern 134, but the present inventive concept is not limited thereto. The insulating spacer 174 may include silicon nitride ($Si_3N_4$) or silicon oxynitride (SiON).

According to an example embodiment of the present inventive concept, the insulating spacer 174 may function as a protection layer in a process of performing ion implantation of at least one of As, Se, S, and Te on the switch material pattern 160A after patterning the first interface layer 152, the switch material pattern 160A, the second interface layer 154, and the upper electrode 170. Also, when the filling insulating layer 172 includes an air space or a dielectric material having a low dielectric constant (or a low-k material), the insulating spacer 174 may function as a protection layer for preventing damage to the side wall of the switch material pattern 160A in a process of forming the filling insulating layer 172.

As illustrated in FIG. 8, the internal area 162 may include As of a first reference content $C_{ref1}$ at a central point thereof and the element injection area 164A may include As of a second reference content $C_{ref2}$ at an outer wall thereof (or the side wall of the switch material pattern 160), in which the second reference content $C_{ref2}$ in the element injection area 164A may be lower than the first reference content $C_{ref1}$ in the internal area 162. A second content Con2 of As in the element injection area 164A may have a profile in which the second content Con2 of As in the element injection area 164A has a highest value at a point of the element injection area 164A, in which the point is apart from the side wall of the switch material pattern 160A, and gradually decreases away from the side wall of the switch material pattern 160A, which may be because As ions are injected from the side wall of the switch material pattern 160A by an ion implantation process. By controlling the dose and energy of the As ions in the ion implantation process, the profile (shape and position of the highest value) of the second content Con2 of As may be controlled. By providing higher energy of As ions in the ion implantation process may move the position of the highest value further inward apart from the side wall of the switch material pattern 160A. The profile of the second content Con2 of As obtained through ion implantation may have the highest value at a position apart from the side wall of the switch material pattern 160A, while the profile of the second content Con2 of As obtained through diffusion may have the highest value on the side wall of the switch material pattern 160A.

Areas that are adjacent to the side wall of the switch material pattern 160A may be exposed to etching chemicals during patterning the switch material pattern 160A, an thus may lose at least one element from among As, S, Se, and Te. In this case, the content ConP of As may decrease toward the side wall of the switch material pattern 160A as indicated by the dotted lines of FIG. 8. As ions may be injected to the side wall of the patterned switch material pattern 160A by an ion implantation process, and the second content Con2 of As may be greater than the content ConP of As after the ion implantation process.

An example of the content profile of As in the switch material pattern 160A is described above. However, the content profile of at least one of Se, S, and Te in the switch material pattern 160A may be similar to the example, and thus, it will not be described in detail.

The content profile of at least one of As, Se, S, and Te may vary based on ion doses and ion energy used in the ion implantation process, and whether a sequential annealing process is performed or not. For example, in an example embodiment of the present inventive concept, the second reference content $C_{ref2}$ in the element injection area 164A may be greater than the first reference content $C_{ref1}$ in the internal area 162 and the second content Con2 of As in the element injection area 164A may have a profile in which the second content Con2 of As gradually decreases away from the side wall of the switch material pattern 160A. For example, according to an example embodiment of the present inventive concept, the second reference content $C_{ref2}$ in the element injection area 164A may be lower than the first reference content $C_{ref1}$ in the internal area 162, and the second content Con2 of As in the element injection area 164A may have a profile in which the second content Con2 of As is constant throughout the element injection area 164A.

According to the example embodiments described above, since ion injection of at least one of As, Se, S, and Te is performed on the side wall of the switch material pattern 160A by the ion implantation process, the loss of the at least one of As, Se, S, and Te may be compensated for. Thus, the memory device 100A may have excellent electrical characteristics and reliability.

Figure 9:
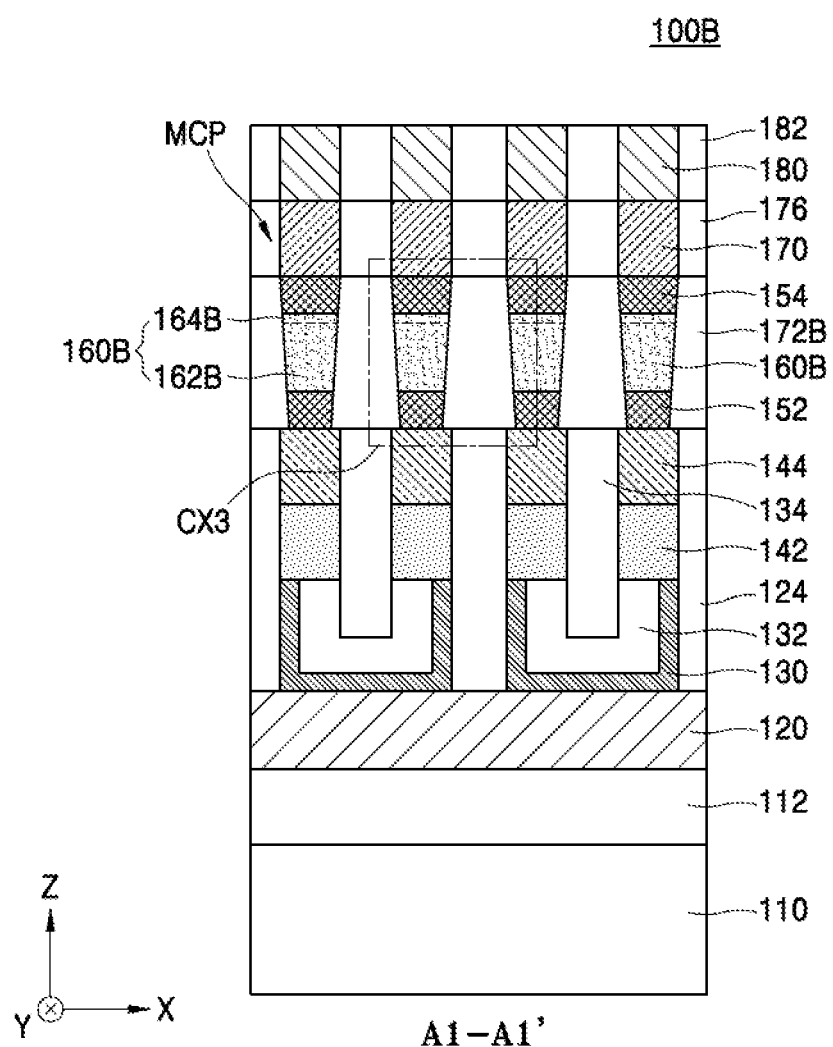
FIG. 9 is a cross-sectional view of a memory device according to an example embodiment of the present inventive concept.
Figure 10:
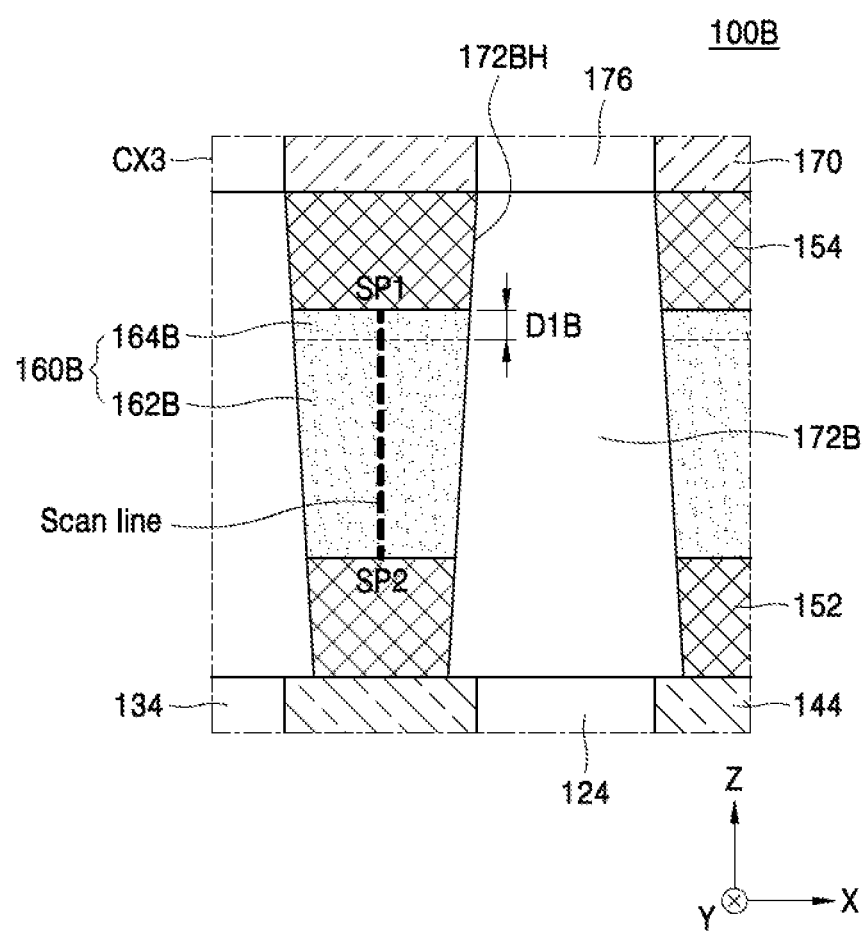
FIG. 10 is an enlarged view of area CX3 of FIG. 9.
Figure 11:
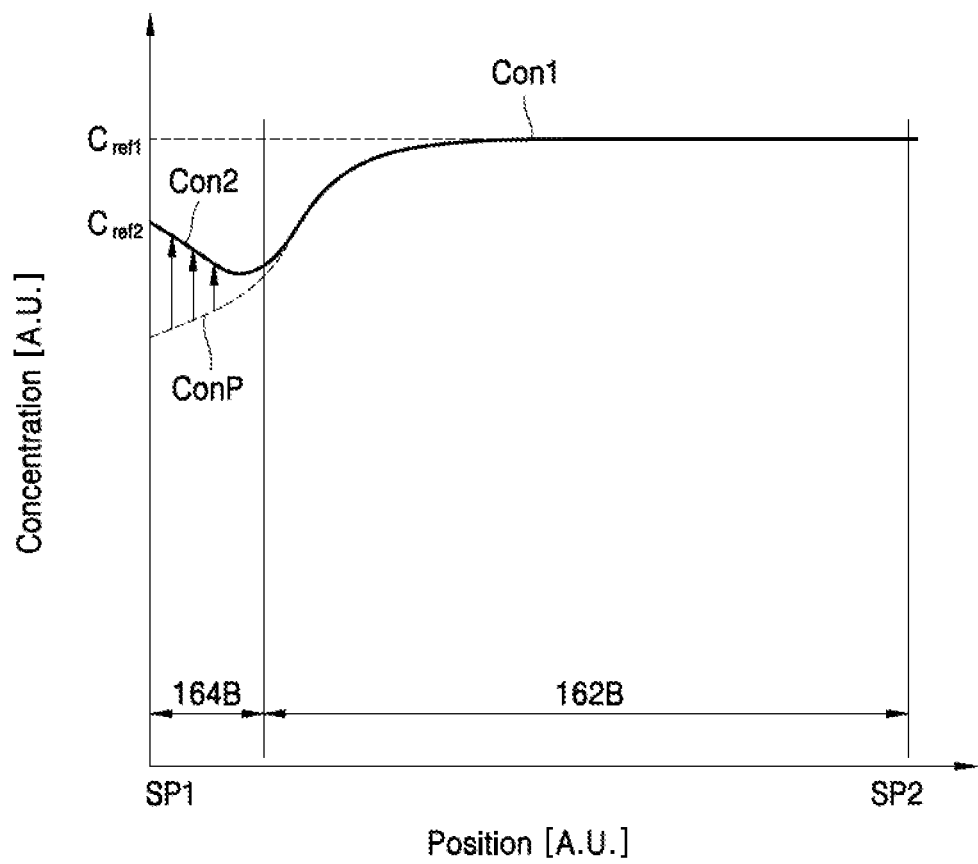
FIGS. 11 and 12 are graphs each showing a schematic content of an element along a scan line area of FIG. 10.
Figure 12:
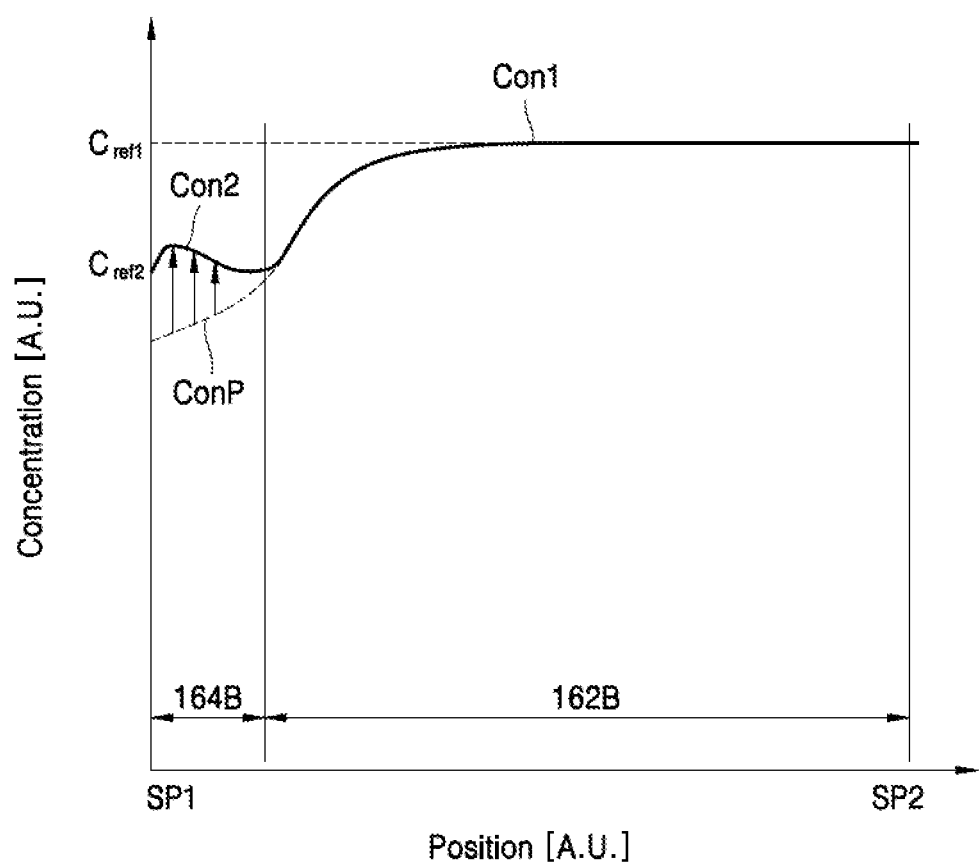

FIG. 9 is a cross-sectional view of a memory device 100B according to an example embodiment of the present inventive concept. FIG. 10 is an enlarged view of area CX3 of FIG. 9. FIGS. 11 and 12 are graphs showing a schematic content of an element along a scan line of FIG. 10. In FIGS. 9 through 12, the same reference numerals as FIGS. 1 through 8 refer to the same components as FIGS. 1 through 8.

Referring to FIGS. 9 through 12, a filling insulating layer 172B may include an opening 172BH, and the first interface layer 152, a switch material pattern 160B, and the second interface layer 154 may be sequentially stacked on the intermediate electrode 144 in the opening 172BH. Thus, side walls of the first interface layer 152, the switch material pattern 160B, and the second interface layer 154 may be surrounded by the filling insulating layer 172B. A width of an entrance of the opening 172BH in a first direction (an X direction), in which the entrance is at a height the same as that of an upper surface of the filling insulating layer 172B, may be greater than a width of a bottom of the opening 172BH in the first direction (the X direction), in which the bottom is at a height the same as that of a bottom surface of the filling insulating layer 172B. An upper surface of the filling insulating layer 172B may be at a height the same as that of an upper surface of the second interface layer 154.

The switch material pattern 160B may include an internal area 162B and an element injection area 164B, in which the element injection area 164B may be arranged on the internal area 162B. The element injection area 164B may be formed in an area of the switch material pattern 160B, in which the area has a first distance D1B from an upper surface of the switch material pattern 160B in a vertical direction (a Z direction), and the element injection area 164B may entirely cover an upper surface of the internal area 162B. For example, a portion of the switching material pattern 160B from the upper surface going downward within the first distance D1B is defined as the element injection area 164B. Since the side walls of the element injection area 164B and the internal area 162B may be surrounded by the filling insulating layer 172B in the fabrication process, the outer portion of the switch material pattern 160B may be at the top portion. Thus, the element injection area 164B is in the outer area (in this case, upper area) of the switch material pattern 160B, and the internal area 162B is in the inner area (in this case, lower area) of the switch material pattern 160B. Also, the first distance D1B may also be referred to as the element injection distance.

The internal area 162B may not be exposed to etching chemicals during an etch back process that is performed on an upper portion of the switch material pattern 160B after the switch material pattern 160B is formed in the opening 172BH of the filling insulating layer 172B. The element injection area 164B may be exposed to the etching chemicals during the etch back process on the upper portion of the switch material pattern 160B, thus losing at least one of As, S, Se, and Te, and the least one of As, S, Se, and Te may be re-injected to the element injection area 164B later by a surface treatment process.

A third insulating layer 176 may be formed on the filling insulating layer 172B to surround a side wall of the upper electrode 170.

Referring to FIG. 11, the content profile of at least one element from among As, S, Se, and Te included in the switch material pattern 160B is schematically illustrated, according to a position on a scan line from a first scan point SP1 to a second scan point SP2 of FIG. 10. According to an example embodiment of the present inventive concept, as illustrated in FIG. 11, the internal area 162B may include As of a first reference content $C_{ref1}$ at a bottom portion of the internal area 162B, the element injection area 164B may include As of a second reference content $C_{ref2}$ at an upper surface of the element injection area 164B, and the second reference content $C_{ref2}$ in the element injection area 164B may be lower than the first reference content $C_{ref1}$ in the internal area 162B. A second content Con2 of As in the element injection area 164B may have a profile in which the second content Con2 of As in the element injection area 164B gradually decreases away from the upper surface of the switch material pattern 160B, which may be because As ions are injected from the upper surface of the switch material pattern 160B by an As-containing plasma treatment process.

Areas that are adjacent to the upper surface of the switch material pattern 160B may be exposed to etching chemicals during a process of exposing an upper side wall of the opening 172BH again by performing an etch back process on the upper portion of the switch material pattern 160B after forming the switch material pattern 160B in the opening 172BH of the filling insulating layer 172B, and thus may lose at least one element from among As, S, Se, and Te. In this case, the content ConP of As may decrease toward the upper surface of the switch material pattern 160B as indicated by the dotted lines of FIG. 11. As ions may be injected to the upper surface of the switch material pattern 160B, on which the etch back process is performed, by a plasma treatment process, and thus, after the plasma treatment process, the second content Con2 of As may be greater than the content ConP of As.

Referring to FIG. 12, the content profile of at least one element from among As, S, Se, and Te included in the switch material pattern 160B is schematically illustrated, according to a position on a scan line from a first scan point SP1 to a second scan point SP2 of FIG. 10. According to an example embodiment of the present inventive concept, as illustrated in FIG. 12, the second content Con2 of As in the element injection area 164B may have a profile in which the second content Con2 of As in the element injection area 164B has a highest value at a point of the element injection area 164B, in which the point is apart from the upper surface of the switch material pattern 160B, and the second content Con2 of As gradually decreases away from the upper surface of the switch material pattern 160I, which may be because As ions are injected from the upper surface of the switch material pattern 160B by an ion injection process. By controlling the dose and energy of the As ions in the ion implantation process, the profile (shape and position of the highest value) of the second content Con2 of As may be controlled. By providing higher energy of As ions in the ion implantation process may move the position of the highest value further downward apart from the upper surface of the switch material pattern 160B. The profile of the second content Con2 of As obtained through ion implantation may have the highest value at a position apart from the upper surface of the switch material pattern 160B as shown in FIG. 12, while the profile of the second content Con2 of As obtained through diffusion (through surface treatment process) may have the highest value on the upper surface of the switch material pattern 160B as shown in FIG. 11.

An example of the content profile of As in the switch material pattern 160B is described above. However, the content profile of at least one of Se, S, and Te in the switch material pattern 160B may be similar to the example, and thus, it will not be described in detail.

The content profile of at least one of As, Se, S, and Te may vary based on ion doses and ion energy used in the ion implantation process, and whether a sequential annealing process is performed or not. For example, in an example embodiment of the present inventive concept, the second reference content $C_{ref2}$ in the element injection area 164B may be greater than the first reference content $C_{ref1}$ in the internal area 162B and the second content Con2 of As in the element injection area 164B may have a profile in which the second content Con2 of As gradually decreases away from the upper surface of the switch material pattern 160B. For example, according to an example embodiment of the present inventive concept, the second reference content $C_{ref2}$ in the element injection area 164B may be lower than the first reference content $C_{ref1}$ in the internal area 162B and the second content Con2 of As in the element injection area 164B may have a profile in which the second content Con2 of As is constant throughout the element injection area 164B.

According to the example embodiments described above, since ion injection of at least one of As, Se, S, and Te is performed on the upper surface of the switch material pattern 160B by the plasma treatment process or the ion implantation process, the loss of the at least one of As, Se, S, and Te may be compensated for. Thus, the memory device 100B may have excellent electrical characteristics and reliability.

Figure 13:
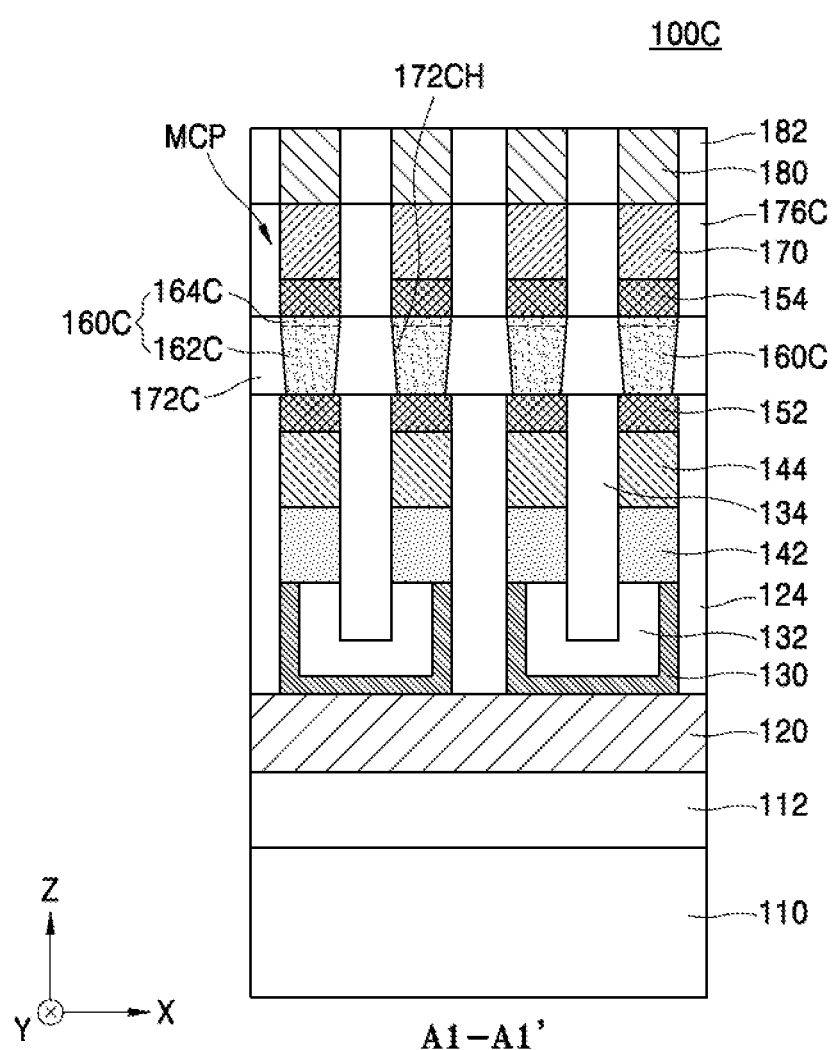
FIG. 13 is a cross-sectional view of a memory device according to an example embodiment of the present inventive concept.

FIG. 13 is a cross-sectional view of a memory device 100C according to an example embodiment of the present inventive concept. In FIG. 13, the same reference numerals as FIGS. 1 through 12 refer to the same components as FIGS. 1 through 12.

Referring to FIG. 13, the first, second, and fourth insulating patterns 124, 126, and 134 may have upper surfaces at a height the same as that of an upper surface of the first interface layer 152, and a side wall of the first interface layer 152 may be surrounded by the first, second, and fourth insulating patterns 124, 126, and 134 (refer to FIG. 2).

A filling insulating layer 172C may include an opening 172CH, and a switch material pattern 160C may be arranged on the upper surface of the first interface layer 152 in the opening 172CH. An upper surface of the filling insulating layer 172C may be at a height the same as that of an upper surface of the switch material pattern 160C. A width of an entrance of the opening 172CH in a first direction (an X direction), in which the entrance is at a height the same as that of the upper surface of the filling insulating layer 172C, may be greater than a width of a bottom of the opening 172CH in the first direction (the X direction), in which the bottom is at a height the same as that of a bottom surface of the filling insulating layer 172C.

A third insulating layer 176C may be formed on the filling insulating layer 172C to surround side walls of the second interface layer 154 and the upper electrode 170.

The switch material pattern 160C may include an internal area 162C and an element injection area 164C, in which the element injection area 164C may be arranged on the internal area 162C. The internal area 162C may not be exposed to etching chemicals while a process of planarizing an upper portion of the switch material pattern 160C is performed via a chemical mechanical polishing (CMP) process until the upper surface of the filling insulating layer 172C is exposed after the switch material pattern 160C is formed in the opening 172CH of the filling insulating layer 172C. The element injection area 164C may be exposed to the etching chemicals during the process of planarizing the upper portion of the switch material pattern 160C, thus losing at least one element from among As, S, Se, and Te, and later, the at least one element may be injected again to the element injection area 164C by a surface treatment process or an ion implantation process. The content profile of at least one of As, S, Se, and Te in the switch material pattern 160C may be similar to that shown in one of the examples illustrated in FIGS. 11 and 12.

According to the example embodiments described above, since ion injection of at least one of As, Se, S, and Te is performed on the upper surface of the switch material pattern 160C by the plasma treatment process or the ion implantation process, the loss of the at least one of As, Se, S, and Te may be compensated for. Thus, the memory device 100C may have excellent electrical characteristics and reliability.

Figure 14:
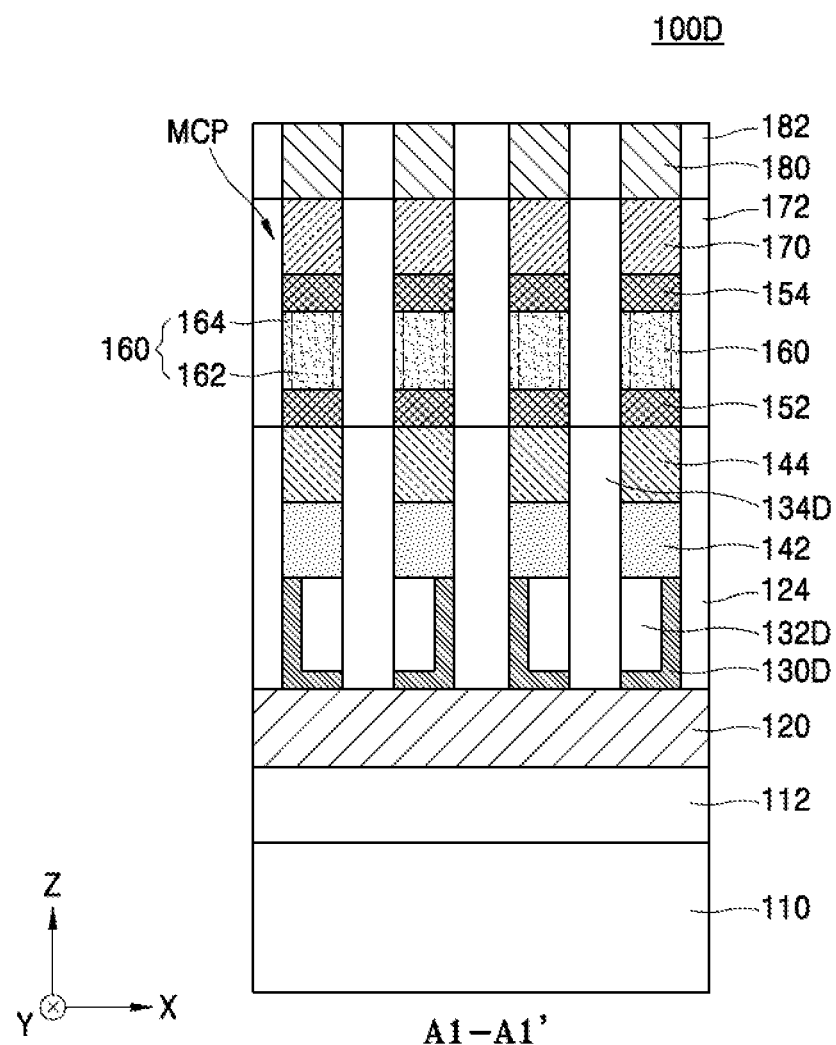
FIG. 14 is a cross-sectional view of a memory device according to an example embodiment of the present inventive concept.

FIG. 14 is a cross-sectional view of a memory device 100D according to an example embodiment of the present inventive concept. In FIG. 14, the same reference numerals as FIGS. 1 through 13 refer to the same components as FIGS. 1 through 13.

Referring to FIG. 14, a heating electrode 130D may have a section having an L-shape. Also, the heating electrode 130D in one memory cell MCP of two memory cells MCP adjacent to each other in a first direction (an X direction) may be spaced apart from the heating electrode 130D in the other memory cell MCP of the two memory cells MCP adjacent to each other in the first direction (the X direction), and may have a mirror-symmetric shape with respect to the heating electrode 130l) in the other memory cell MCP. A fourth insulating pattern 134D may extend in a vertical direction (a Z direction) between two memory cells MCP adjacent to each other in the first direction and may contact a side wall of a third insulating pattern 132D and upper surfaces of the plurality of first conductive lines 120. The heating electrode 130D illustrated in FIG. 14 may be different from the heating electrode 130 illustrated in FIG. 2. The heating electrode 130 of FIG. 2 may be formed to have a U-shaped cross-section and one heating electrode 130 may be shared by two adjacent memory cells MCP, while the heating electrode 130D of FIG. 14 may have an L-shaped cross-section and may not be shared by adjacent memory cells MCP.

Figure 15:
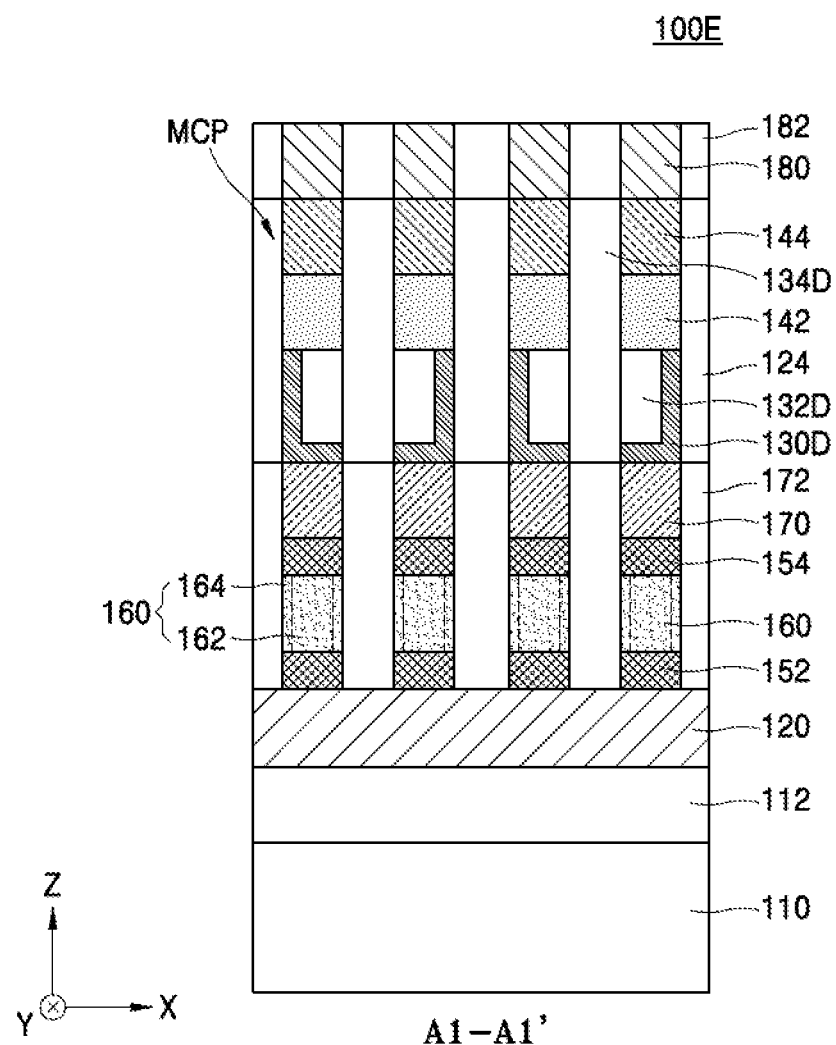
FIG. 15 is a cross-sectional view of a memory device according to an example embodiment of the present inventive concept.

FIG. 15 is a cross-sectional view of a memory device 100E according to an example embodiment of the present inventive concept. In FIG. 15, the same reference numerals as FIGS. 1 through 14 refer to the same components as FIGS. 1 through 14.

Referring to FIG. 15, each of the plurality of memory cells MCP may include the first interface layer 152, the switch material pattern 160, the second interface layer 154, the upper electrode 170, the heating electrode 130D, the variable resistance memory layer 142, and the intermediate electrode 144 sequentially stacked over the plurality of first conductive lines 120.

The filling insulating layer 172 may be arranged on the plurality of first conductive lines 120 and the first insulating layer 122 (refer to FIG. 2) to surround side walls of the first interface layer 152, the switch material pattern 160, the second interface layer 154, and the upper electrode 170. The first, second, and fourth insulating patterns 124, 126, and 134D (refer to FIG. 2) may be arranged on the filling insulating layer 172 to surround side walls of the heating electrode 130D, the variable resistance memory layer 142, and the intermediate electrode 144. The memory device 100E illustrated in FIG. 15 may differ from the memory device 100D illustrated in FIG. 14 by switching the position of a first structure including the first interface layer 152, the switch material pattern 160, the second interface layer 154, the upper electrode 170, and the filling insulating layer 172, with the position of a second structure including the heating electrode 130D, the variable resistance memory layer 142, the intermediate electrode 144 and the first to fourth insulating patterns 124, 126, 132D and 134D.

FIGS. 16A through 16J are cross-sectional views for describing a method of manufacturing the memory device 100, according to an example embodiment of the present inventive concept.

Figure 16A:
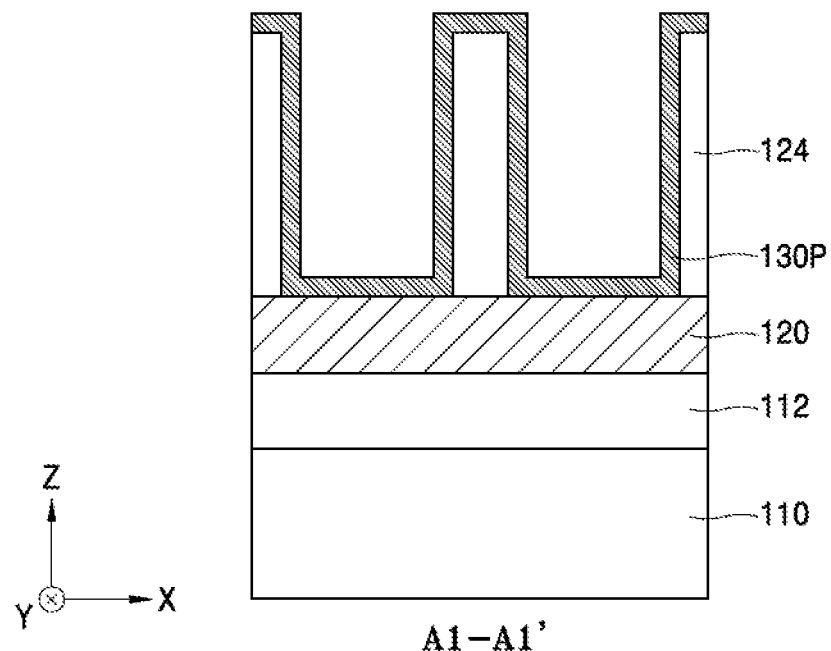
FIGS. 16A through 16J are cross-sectional views for describing a method of manufacturing a memory device, according to an example embodiment of the present inventive concept.

Referring to FIG. 16A, the first interlayer insulating layer 112 may be formed on the substrate 110. A conductive layer may be formed on the first interlayer insulating layer 112 and the conductive layer may be patterned to form the plurality of first conductive lines 120. Thereafter, an insulating layer may be formed over the plurality of first conductive lines 120 and the first interlayer insulating layer 112, and an upper portion of the insulating layer may be planarized until upper surfaces of the plurality of first conductive lines 120 are exposed, to form the first insulating layer 122 (refer to FIG. 2).

According to an example embodiment of the present inventive concept, the first insulating layer 122 may be formed on the first interlayer insulating layer 112 and then an opening extending in a first direction (an X direction) may be formed on the first insulating layer 122. Thereafter, the opening may be filled with a conductive layer, and an upper portion of the conductive layer may be planarized until an upper surface of the first insulating layer 122 is exposed, to form the plurality of first conductive lines 120.

Thereafter, the first insulating pattern 124 may be formed over the plurality of first conductive lines 120 and the first insulating layer 122. The first insulating pattern 124 may be formed to have a shape of a plurality of lines extending in a second direction (a Y direction).

A heating electrode layer 130P may be conformally formed on upper surfaces of the plurality of first conductive lines 120, the upper surface of the first insulating layer 122, and a side wall and an upper surface of the first insulating pattern 124.

Figure 16B:
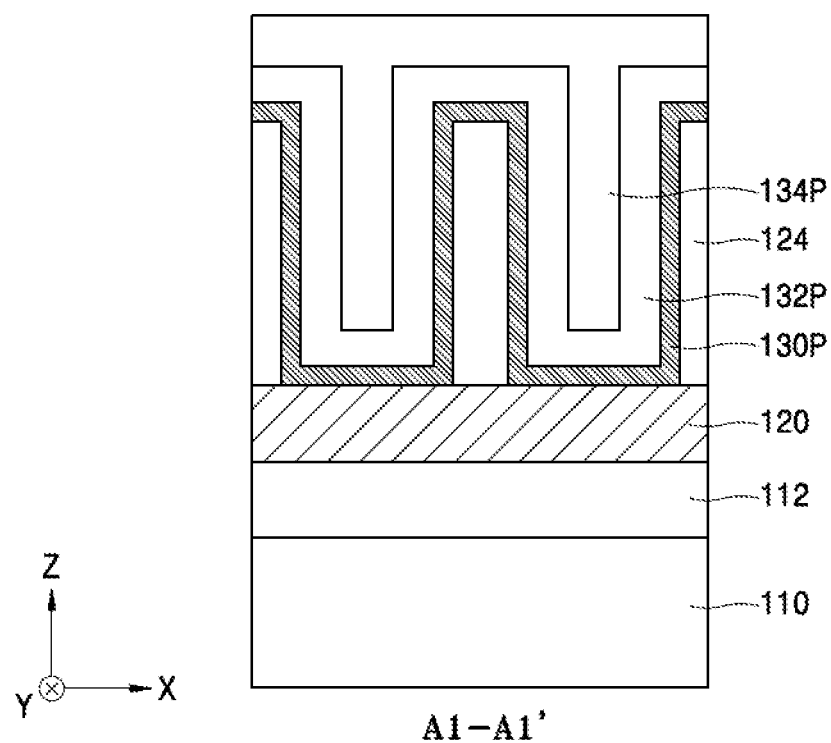

Referring to FIG. 16B, a spacer insulating layer 132P and a filling insulation layer 134P may be sequentially formed on the heating electrode layer 130P. The spacer insulating layer 132P may be conformally formed on the heating electrode layer 130P, and may not completely fill the space surrounded by the side wall of the heating electrode layer 130P. The filling insulation layer 134P may be formed to fill the remaining space after the forming of the spacer insulating layer 132P. Materials of the spacer insulating layer 132P and the filling insulation layer 134P may be respectively the same as materials of the third insulating pattern 132 and the fourth insulating pattern 134 described with reference to FIGS. 2 through 4.

Figure 16C:
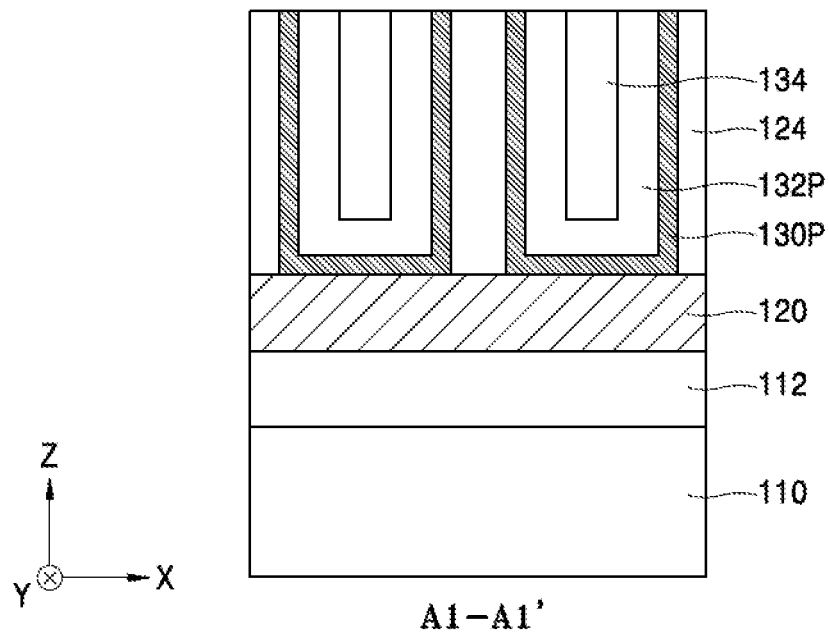

Referring to FIG. 16C, upper portions of the heating electrode layer 130P, the spacer insulating layer 132P, and the filling insulation layer 134P (refer to FIG. 16B) may be removed to expose an upper surface of the first insulating pattern 124. A process for removing the upper portions of the heating electrode layer 130P, the spacer insulating layer 132P, and the filling insulation layer 134P may include a CMP process or an etch back process.

Next, a mask pattern may be formed on the first insulating pattern 124, the heating electrode layer 130P, the spacer insulating layer 132P, and the filling insulation layer 134P. Portions of the first insulating pattern 124, the heating electrode layer 130P, the spacer insulating layer 132P, and the filling insulation layer 134P may be removed by using the mask pattern as an etch mask. The mask pattern may have a shape of a plurality of lines extending in the first direction (the X direction) and may be arranged to vertically overlap the plurality of first conductive lines 120. Accordingly, the portions of the first insulating pattern 124, the heating electrode layer 130P, the spacer insulating layer 132P, and the filling insulation layer 134P may be removed and the upper surface of the first insulating layer 122 may be exposed again.

Thereafter, an insulating material may be filled in a position from which the portions of the first insulating pattern 124, the heating electrode layer 130P, the spacer insulating layer 132P, and the filling insulation layer 134P are removed, to form the second insulating pattern 126 (refer to FIG. 2). Here, a remaining portion of the filling insulation layer 134P may be referred to as the fourth insulating pattern 134.

Figure 16D:
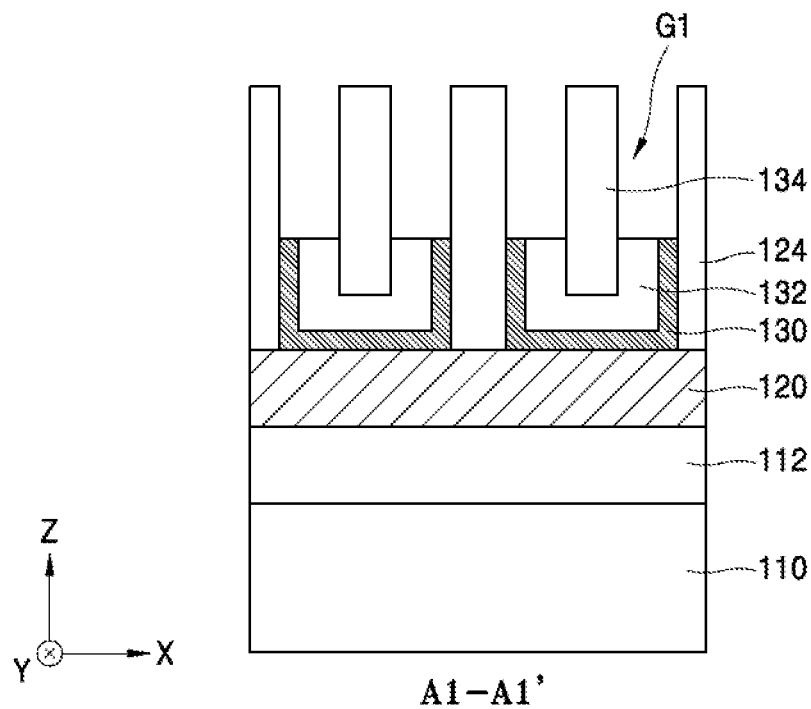

Referring to FIG. 16D, the upper portions of the heating electrode layer 130P (refer to FIG. 16C) and the spacer insulating layer 132P (refer to FIG. 16C) may be removed by an etch back process to form the heating electrode 130 and the third insulating pattern 132. The upper surface of the heating electrode 130 may be at a height the same as that of an upper surface of the third insulating pattern 132 and may be at a height lower than that of an upper surface of the first insulating pattern 124. Via the etch back process, a first gap G1 may be defined on the heating electrode 130 and the third insulating pattern 132, between the first insulating pattern 124 and the fourth insulating pattern 134.

Figure 16E:
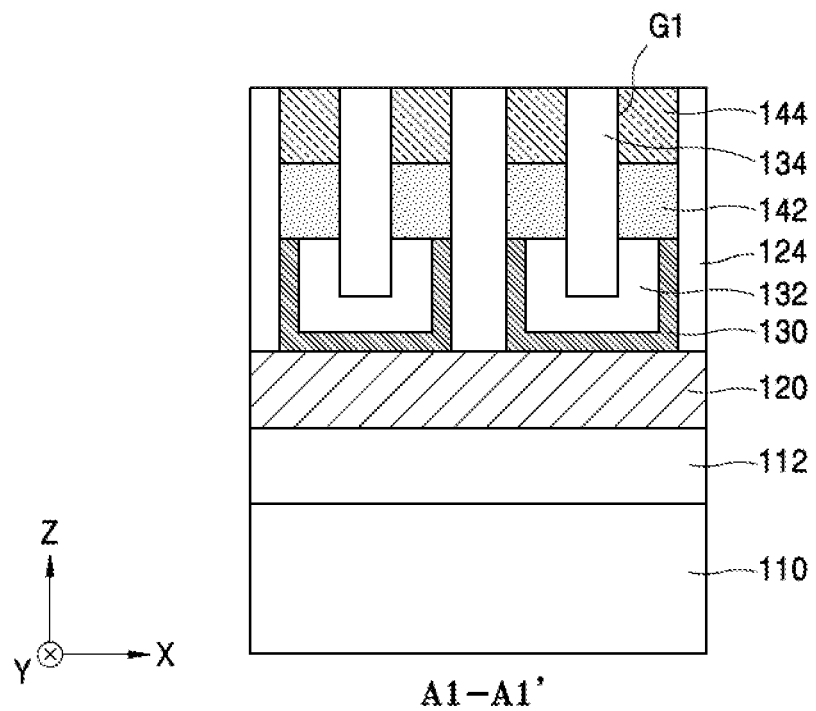

Referring to FIG. 16E, the variable resistance memory layer 142 and the intermediate electrode 144 filling the first gap G1 may be sequentially formed on the heating electrode 130 and the third insulating pattern 132.

Figure 16F:
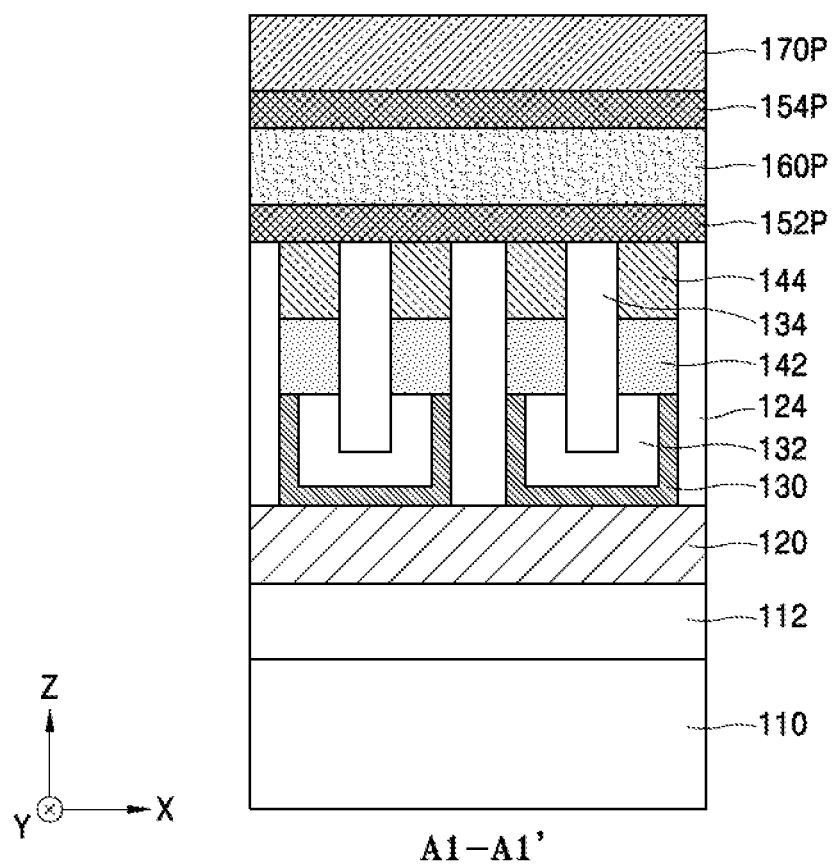

Referring to FIG. 16F, a preliminary first interface layer 152P, a preliminary switch material layer 160P, a preliminary second interface layer 154P, and a preliminary upper electrode layer 170P may be sequentially formed on the intermediate electrode 144 and the first, second, and fourth insulating patterns 124, 126, and 134 (refer to FIG. 2).

Figure 16G:
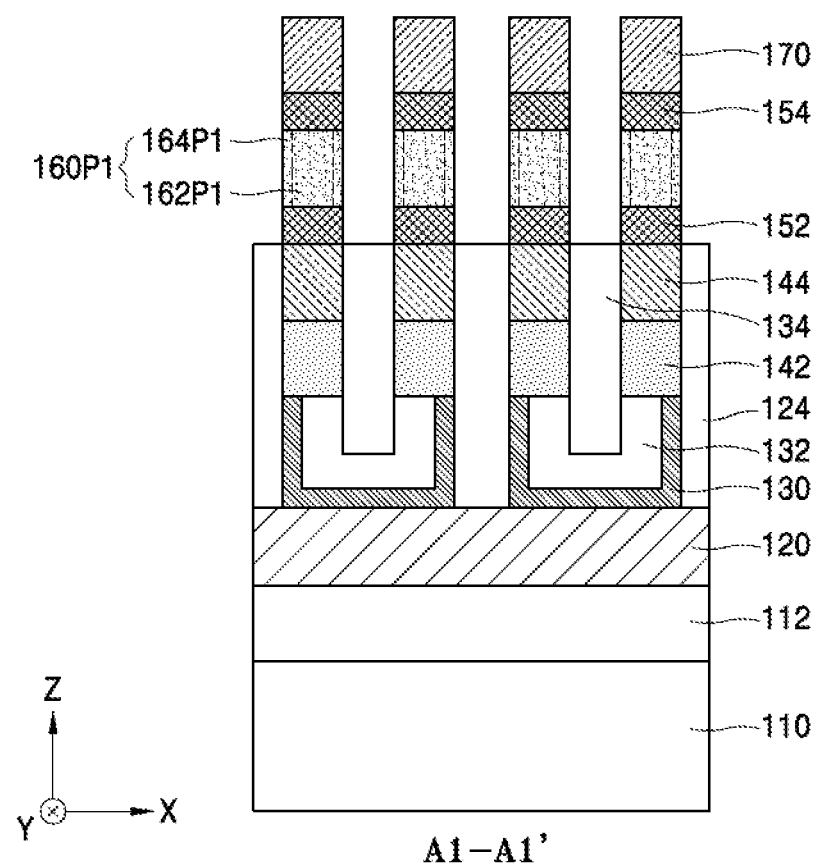

Referring to FIG. 16G, a mask pattern may be formed on the preliminary upper electrode layer 170P, and the preliminary first interface layer 152P, the preliminary switch material layer 160P, the preliminary second interface layer 154P, and the preliminary upper electrode layer 170P may be patterned using the mask pattern as an etch mask to form the first interface layer 152, a preliminary switch material pattern 160P1, the second interface layer 154, and the upper electrode 170 sequentially arranged on the intermediate electrode 144.

According to an example embodiment of the present inventive concept, the mask pattern may have a shape of a plurality of islands spaced apart from one another in the first direction (the X direction) and the second direction (the Y direction). The first interface layer 152, the preliminary switch material pattern 160P1, the second interface layer 154, and the upper electrode 170 that are patterned by using the mask pattern having the shape of the plurality of islands as an etch mask may have a shape of a plurality of islands spaced apart from one another in the first direction (the X direction) and the second direction (the Y direction) in a planar perspective. After the patterning process, side walls of the first interface layer 152, the preliminary switch material pattern 160P1, the second interface layer 154, and the upper electrode 170 may be collinearly aligned.

According to an example embodiment of the present inventive concept, a first mask pattern having a shape of a plurality of lines extending in the first direction (the X direction) may be formed on the preliminary upper electrode layer 170P, and the preliminary first interface layer 152P, the preliminary switch material layer 160P, the preliminary second interface layer 154P, and the preliminary upper electrode layer 170P may be patterned using the first mask pattern as an etch mask, and then, a space filling insulating layer may be formed in a space from which the materials are removed. Then, a second mask pattern having a shape of a plurality of lines extending in the second direction (the Y direction) may be formed on the preliminary upper electrode layer 170P and the space filling insulating layer, and the preliminary first interface layer 152P, the preliminary switch material layer 160P, the preliminary second interface layer 154P, and the preliminary upper electrode layer 170P may be patterned using the second mask pattern as an etch mask to form the first interface layer 152, the preliminary switch material pattern 160P1, the second interface layer 154, and the upper electrode 170. After the above described patterning process, side walls of the first interface layer 152, the preliminary switch material pattern 160P1, the second interface layer 154, and the upper electrode 170 may be col-linearly aligned.

During the patterning process, a side wall of the preliminary switch material pattern 160P1 may be exposed to etching chemicals so that an element included in a side wall area 164P1 of the preliminary switch material pattern 160P1, for example, at least one element from among As, Se, S, and Te, may be volatilized or removed in an etching atmosphere. However, an internal area 162P1 of the preliminary switch material pattern 160P1 may not be exposed to the etching chemicals. Accordingly, at least one of As, Se, S, and Te included in the side wall area 164P1 of the preliminary switch material pattern 160P1 may have the content profile ConP illustrated in FIG. 5.

Figure 16H:
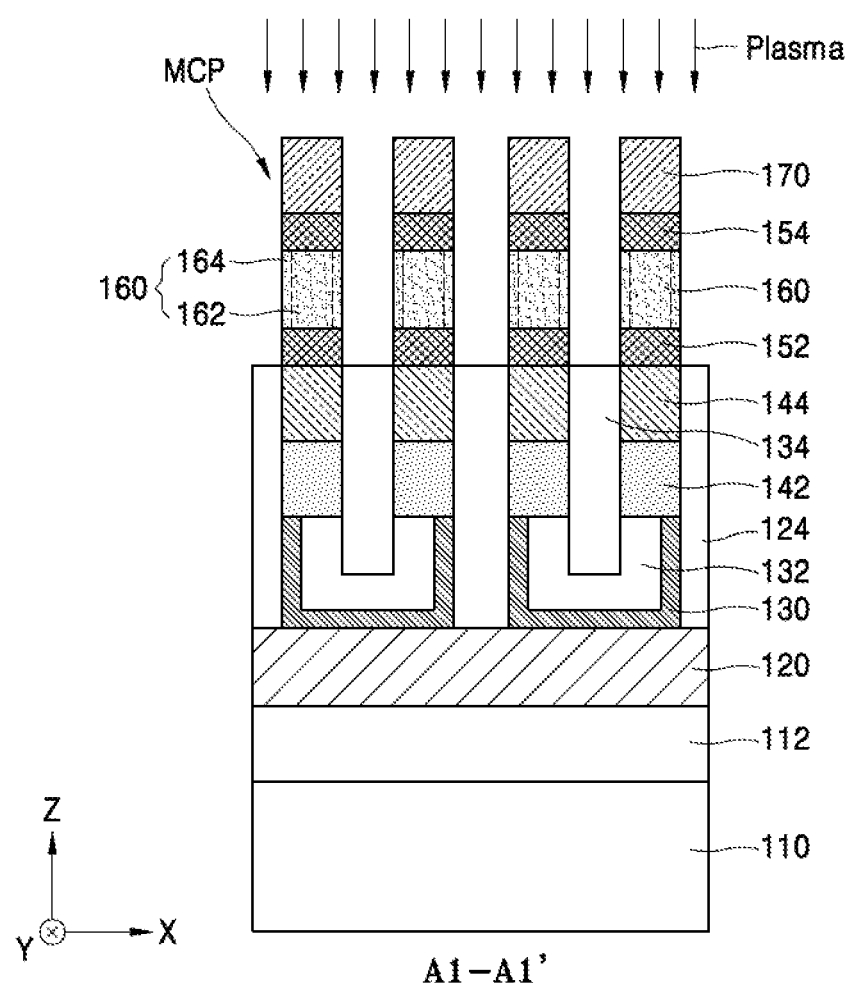

Referring to FIG. 16H, the switch material pattern 160 including the element injection area 164 may be formed by injecting at least one element from among As, Se, S, and Te into the side wall area 164P1 of the preliminary switch material pattern 160P1 by performing a plasma treatment process on a structure in which the preliminary switch material pattern 160P1 (refer to FIG. 16G) is formed. An area of the switch material pattern 160, in which the area is surrounded by the element injection area 164, may be referred to as the internal area 162, and the internal area 162 may not be affected by the plasma treatment process. At least one element from among As, Se, S, and Te included in the element injection area 164 may have the profile of the second content Con2 illustrated in FIG. 5 and the second content Con2 may be greater than the content profile ConP after the plasma treatment process.

At least one of an As-containing plasma treatment process, a Se-containing plasma treatment process, an S-containing plasma treatment process, and a Te-containing plasma treatment process may be performed according to a material included in the preliminary switch material pattern 160P1. According to an example embodiment of the present inventive concept, when the preliminary switch material pattern 160P1 includes Ge of about 10 to about 20 at %, As of about 15 to about 40 at %, Sc of about 40 to about 60 at %, and Si of about 5 to about 15 at %, the As-containing plasma treatment process and the Se-containing plasma treatment process may be sequentially or simultaneously performed.

According to an example embodiment of the present inventive concept, the As-containing plasma treatment process may be a plasma treatment process including, for example, arsine ($AsH_3$), tris(dimethylamino)arsine (TD-MAAs), or tris(trimethylsilyl)arsine, as a source material of the As element.

According to an example embodiment of the present inventive concept, the Se-containing plasma treatment process may be a plasma treatment process including, for example, hydrogen selenide ($H_2Se$), diethyl selenide, dimethyl diselenide, ethyl methyl selenide, or a silyl selenium precursor, as a source material of the Se element. The silyl Se precursor may include at least one of, for example, bis(trimethylsilyl)selenium, bis(dimethylsilyl)selenium, bis (triethylsilyl)selenium, bis(diethylsilyl)selenium, bis(phenyldimethylsilyl)selenium, bis(t-butyldimethylsilyl)selenium, dimethylsilylmethyl selenium, dimethylsilylphenyl selenium, dimethylsilyl-n-butyl selenium, dimethylsilyl-t-butyl selenium, trimethylsilylmethyl selenium, trimethylsilylphenyl selenium, trimethylsilyl-n-butyl selenium, and trimethylsilyl-t-butyl selenium.

According to an example embodiment of the present inventive concept, the S-containing plasma treatment process may be a plasma treatment process including, for example, hydrogen sulfide ($H_2S$), dimethyl disulfide, diethyl sulfide, ethyl methyl sulfide, a thiol precursor, or a silylsulfide precursor, as a source material of the S element. The thiol precursor may include at least one of, for example, methanethiol, ethanethiol, propanethiol, butanethiol, pentanethiol, octanethiol, decanethiol, and dodecanethiol, and the silylsulfide precursor may include at least one of bis (trimethylsilyl) sulfide and trimethylsilyl sulfide.

According to an example embodiment of the present inventive concept, the Te-containing plasma treatment process may be a plasma treatment process including, for example, hydrogen telluride ($H_2Te$), dimethyl telluride, diethyl telluride, ethyl methyl telluride, or a silyl Te precursor, as a source material of the Te element. For example, the silyl Te precursor may include at least one of, for example, bis(trimethylsilyl)tellurium, bis(dimethylsilyl)tellurium, bis (triethylsilyl)tellurium, bis(diethylsilyl)tellurium, bis(phenyldimethylsilyl)tellurium, bis(t-butyldimethylsilyl)tellurium, dimethylsilylmethyl tellurium, dimethylsilylphenyl tellurium, dimethylsilyl-n-butyl tellurium, dimethylsilyl-t-butyl tellurium, trimethylsilylmethyl tellurium, trimethylsilylphenyl tellurium, trimethylsilyl-n-butyl tellurium, and trimethylsilyl-t-butyl tellurium.

Figure 16I:
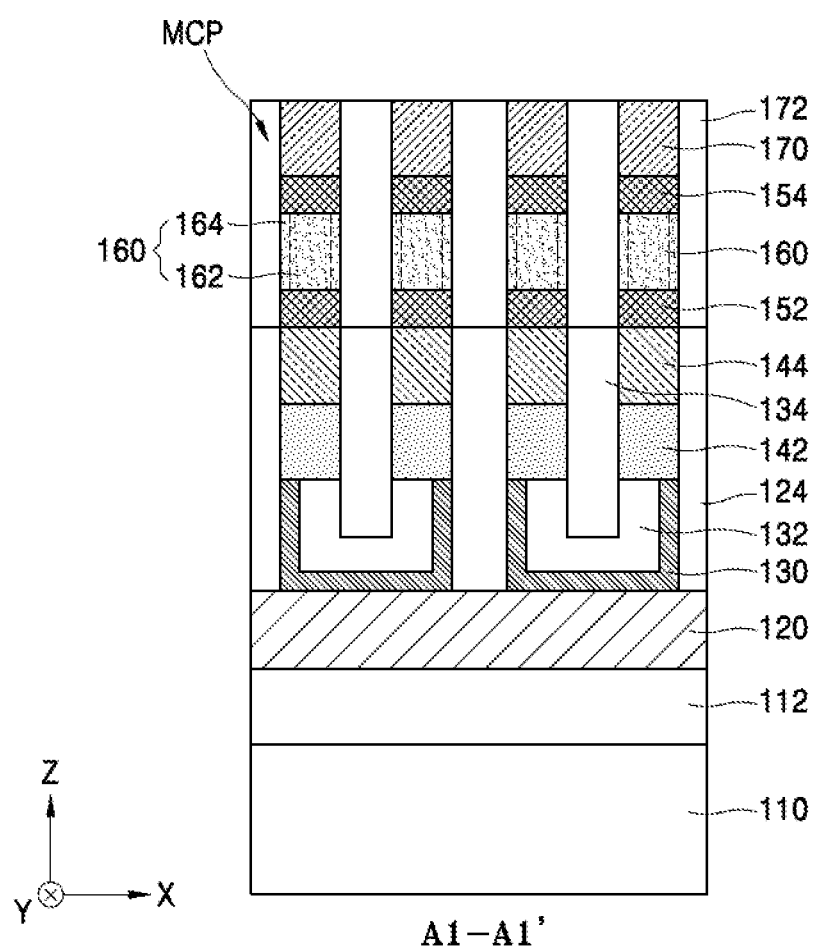

Referring to FIG. 16I, an insulating material may be formed to fill spaces among the plurality of memory cells MCP and an upper portion of the insulating material may be removed to expose an upper surface of the upper electrode 170 to form the filling insulating layer 172.

Figure 16J:
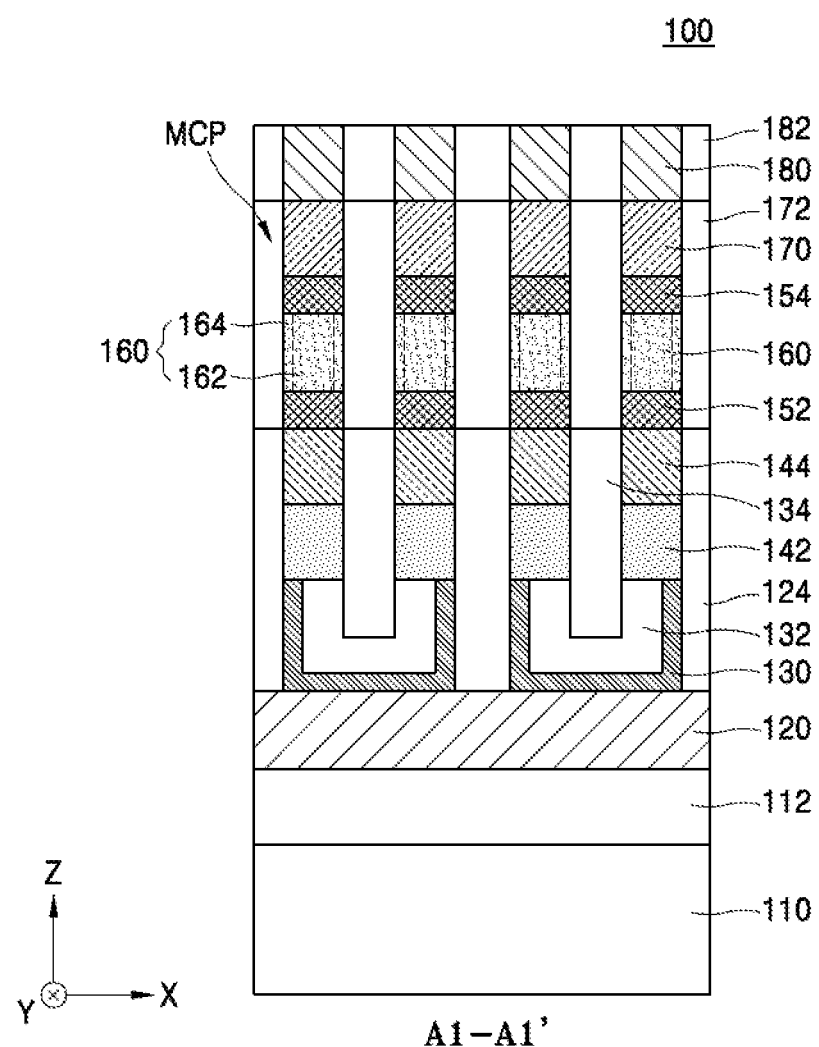

Referring to FIG. 16J, the plurality of second conductive lines 180 extending in the second direction (the Y direction) and the second insulating layer 182 filling spaces among the plurality of second conductive lines 180 may be formed on the upper electrode 170 and the filling insulating layer 172.

The memory device 100 may be manufactured by performing the processes described above. According to the method of manufacturing the memory device 100, at least one element from among As, Se, S, and Te may be volatilized or removed from a side wall portion of the switch material pattern 160, in which the side wall portion is exposed to etching chemicals during a patterning process for forming the switch material pattern 160. After the patterning process, a plasma treatment process including at least one element from among As, Se, S, and Te may be performed to form the element injection area 164 at the side wall portion of the switch material pattern 160. Since the at least one element from among As, Se, S, and Te may be re-supplied to the element injection area 164 by the plasma treatment process, the loss of the at least one of As, Se, S, and Te may be compensated for. Thus, the memory device 100 may have excellent electrical characteristics and reliability.

FIGS. 17A through 17D are cross-sectional views for describing a method of manufacturing the memory device 100A, according to an example embodiment of the present inventive concept.

First, the processes described with reference to FIGS. 16A through 16G are performed to form a structure in which the preliminary switch material pattern 160P1 is formed.

Figure 17A:
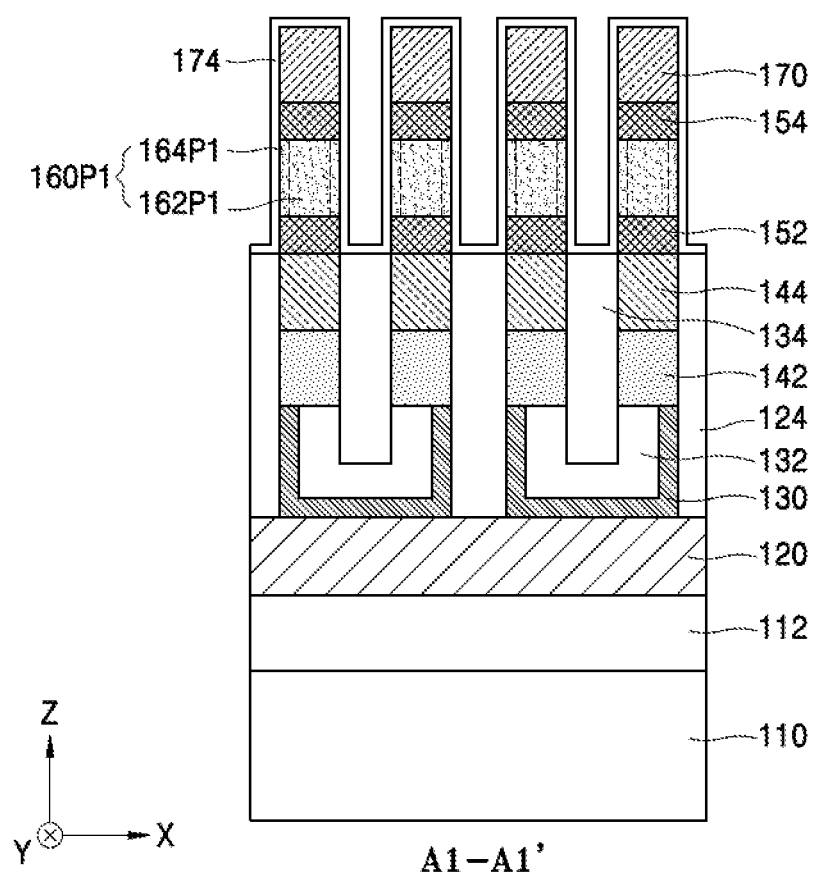
FIGS. 17A through 17D are cross-sectional views for describing a method of manufacturing a memory device, according to an example embodiment of the present inventive concept.

Referring to FIG. 17A, the insulating spacer 174 may be conformally formed on the side walls of the first interface layer 152, the preliminary switch material pattern 160P1, and the second interface layer 154, and the side wall and the upper surface of the upper electrode 170. The insulating spacer 174 may also be formed on the upper surfaces of the first, second, and fourth insulating patterns 124, 126, and 134 (refer to FIG. 2).

Figure 17B:
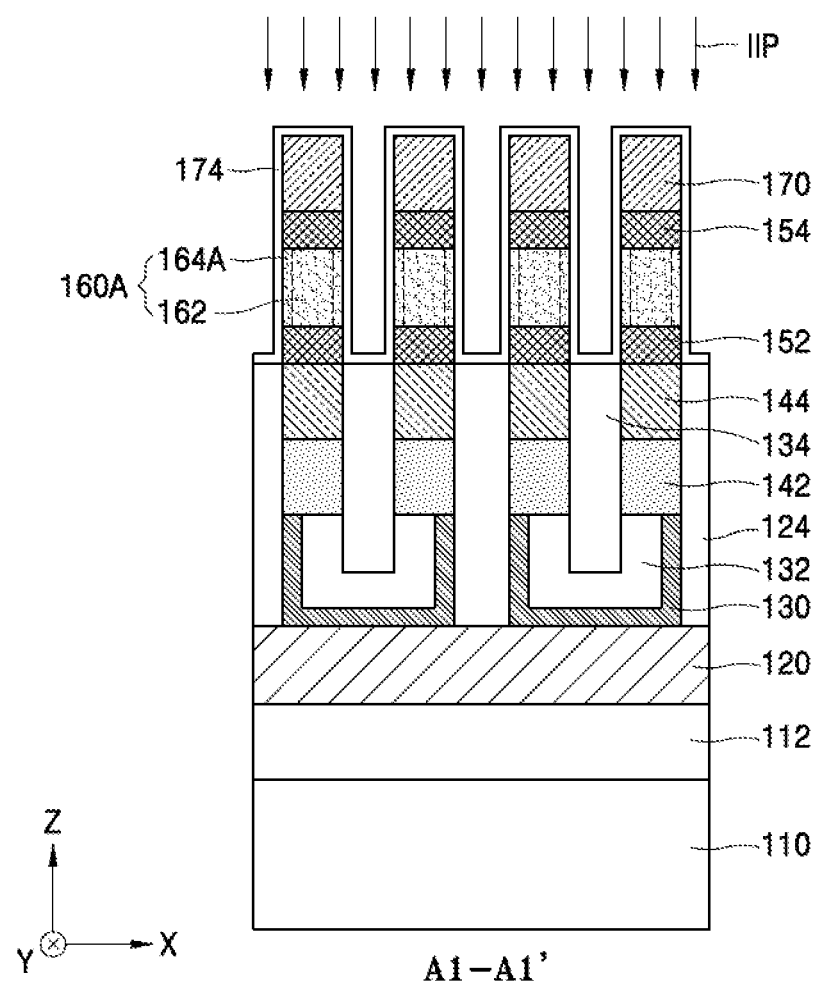

Referring to FIG. 17B, the switch material pattern 160A including the element injection area 164A may be formed by injecting at least one of As, Se, S, and Te into the side wall area 164P1 of the preliminary switch material pattern 160P1 by performing an ion implantation process (IIP) on the structure in which the preliminary switch material pattern 160P1 (refer to FIGS. 16G and 17A) is formed. The internal area 162 of the switch material pattern 160A, in which the internal area 162 is surrounded by the element injection area 164A, may not be affected by the ion implantation process. At least one of As, Se, S, and Te included in the element injection area 164A may have the profile of the second content Con2 illustrated in FIG. 8, and the second content Con2 may be greater than the content profile ConP after the ion implantation process.

According to an example embodiment of the present inventive concept, the ion implantation process may be performed by injecting at least one of As, Se, S, and Te as an ion form by using energy of about 30 to about 500 keV. The ion implantation process may be a tilted ion implantation process, but the present inventive concept is not limited thereto. Selectively, an annealing process may further be performed after the ion implantation process.

Figure 17C:
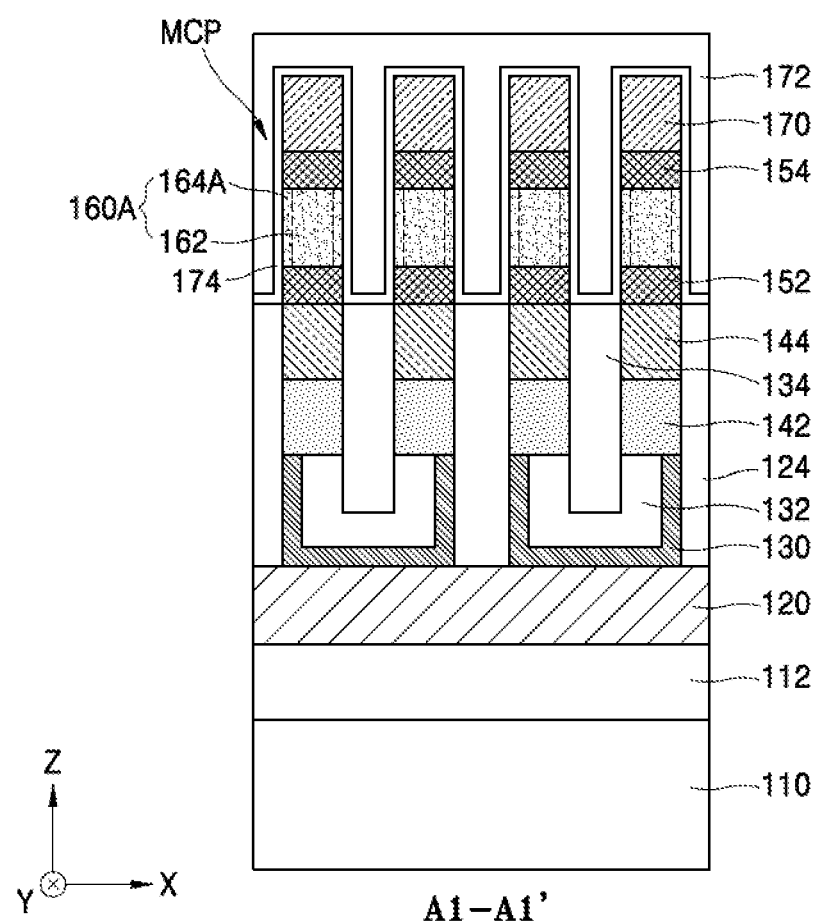

Referring to FIG. 17C, the filling insulating layer 172 may be formed on the insulating spacer 174. The filling insulating layer 172 may be formed of at least one of, for example, silicon oxide ($SiO_2$), silicon oxynitride (SiON), and a low-k dielectric material.

Figure 17D:
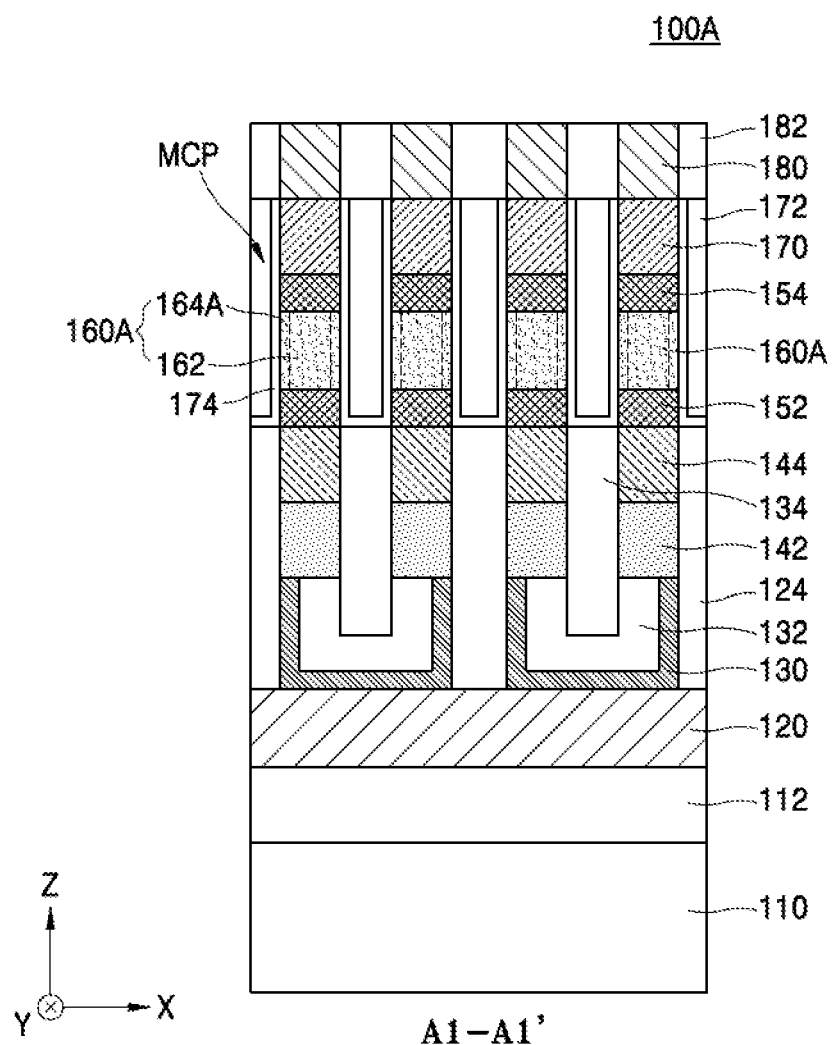

Referring to FIG. 17D, upper portions of the filling insulating layer 172 and the insulating spacer 174 may be removed until an upper surface of the upper electrode 170 is exposed. Thereafter, the plurality of second conductive lines 180 extending in the second direction (the Y direction) and the second insulating layer 182 filling spaces among the plurality of second conductive lines 180 may be formed on the upper electrode 170 and the filling insulating layer 172.

The memory device 100A may be manufactured by performing the processes described above. According to the method of manufacturing the memory device 100A, the element injection area 164A may be formed at the side wall portion of the switch material pattern 160A by performing the ion implantation process using at least one element from among As, Se, S, and Te after the patterning process for forming the switch material pattern 160A. Since the at least one element from among As, Se, S, and Te may be re-supplied to the element injection area 164A by the ion implantation process, the loss of the at least one of As, Se, S, and Te may be compensated for. Thus, the memory device 100A may have excellent electrical characteristics and reliability.

FIGS. 18A through 18F are cross-sectional views for describing a method of manufacturing the memory device 100B, according to an example embodiment of the present inventive concept.

First, the processes described with reference to FIGS. 16A through 16E are performed to form a structure in which the intermediate electrode 144 is formed.

Figure 18A:
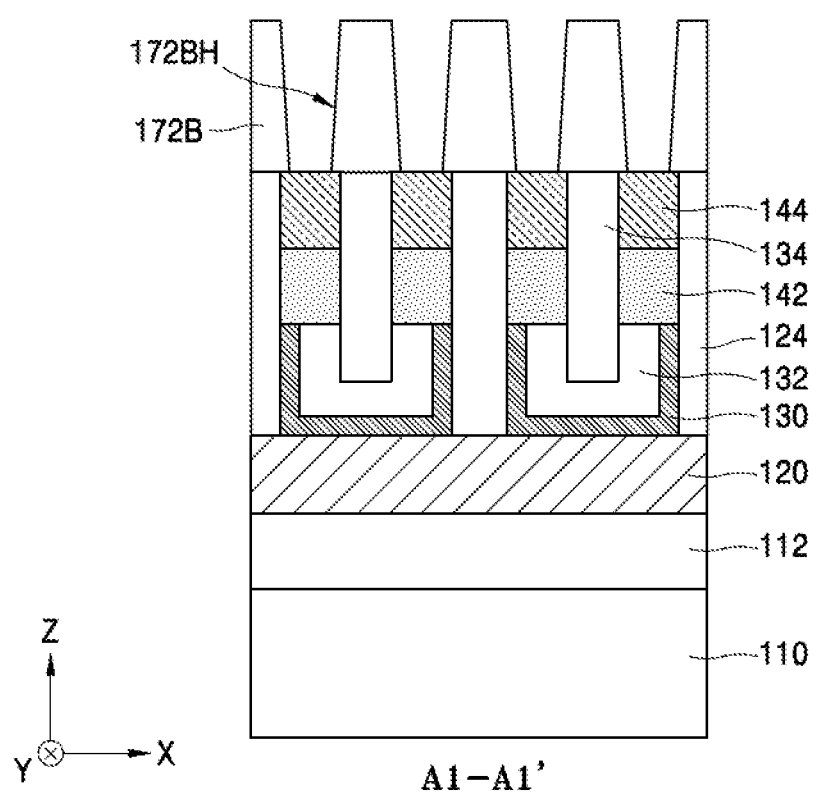
FIGS. 18A through 18F are cross-sectional views for describing a method of manufacturing a memory device, according to an example embodiment of the present inventive concept.

Referring to FIG. 18A, the filling insulating layer 172B may be formed on the intermediate electrode 144, and the first, second, and fourth insulating patterns 124, 126, and 134 (refer to FIG. 2), and a portion of the filling insulating layer 172B may be removed to form the opening 172BH exposing an upper surface of the intermediate electrode 144.

Figure 18B:
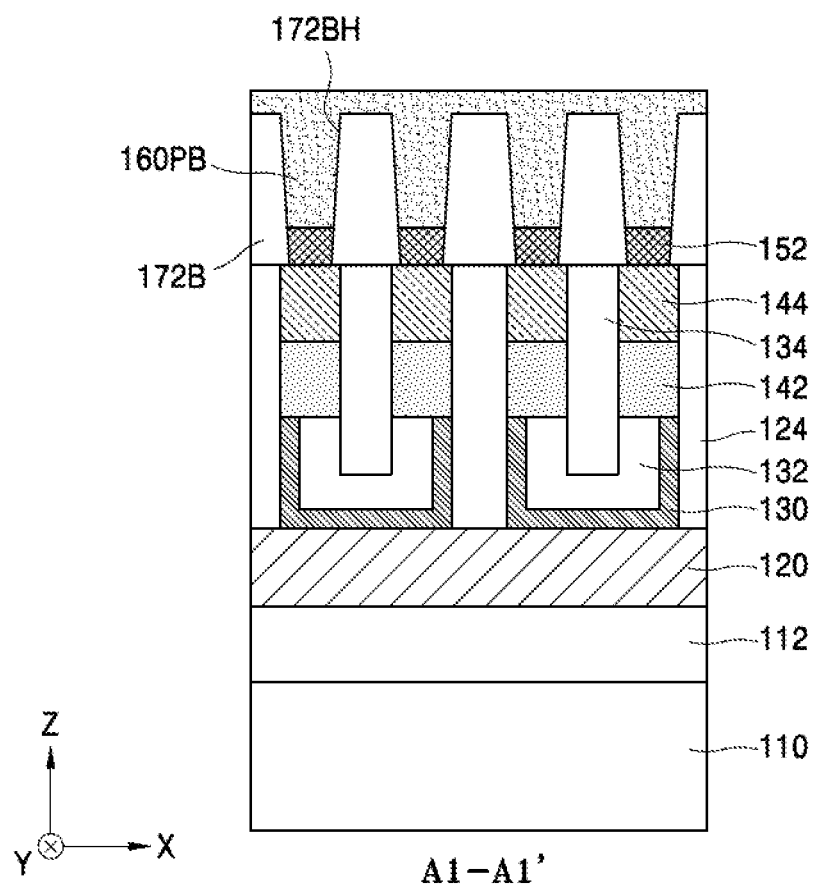

Referring to FIG. 18B, the first interface layer 152 may be formed on the filling insulating layer 172B and the intermediate electrode 144 to have a certain thickness from a bottom of the opening 172BH. An etch back process may further be performed such that the first interface layer 152 remains only at the bottom portion of the opening 172BH and an upper surface of the first interface layer 152 is flat.

Thereafter, a preliminary switch material layer 160PB may be formed to fill the remaining portion of the opening 172BH on the filling insulating layer 172B and the first interface layer 152.

Figure 18C:
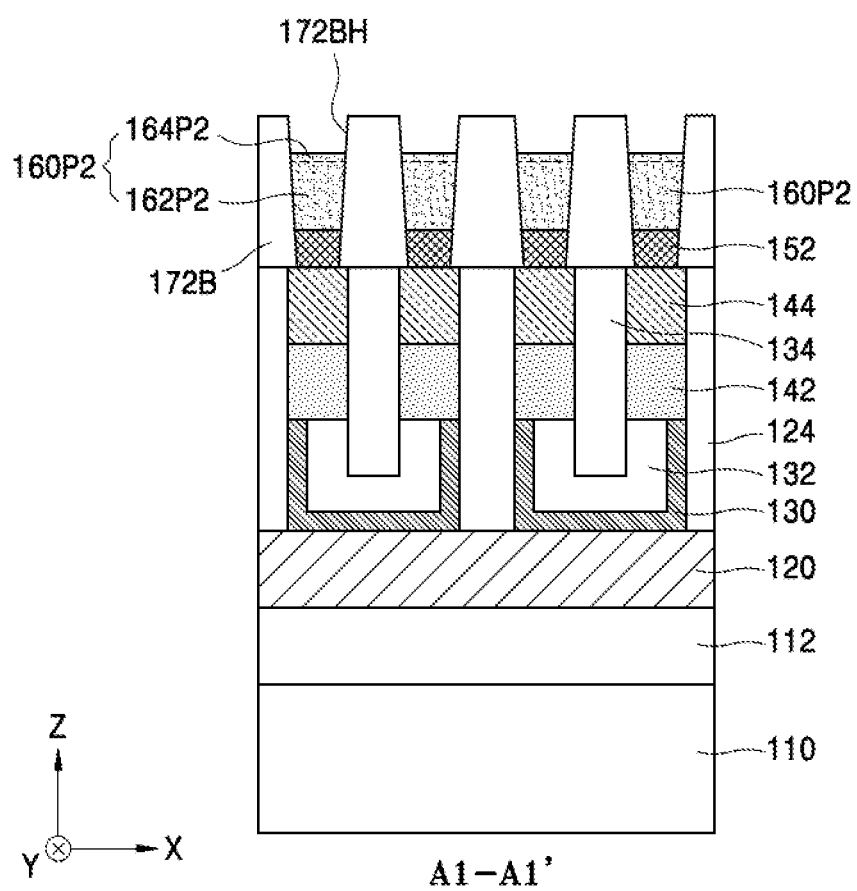

Referring to FIG. 18C, a preliminary switch material pattern 160P2 may be formed by removing an upper portion of the preliminary switch material layer 160PB by a certain thickness. An etch back process may further be performed, such that the preliminary switch material pattern 160P2 remains only at the middle portion of the opening 172BH on top of the first interface layer 152, and an upper surface of the preliminary switch material pattern 160P2 is flat. During the etch back process, an upper surface area 164P2 of the preliminary switch material pattern 160P2 may be exposed to etching chemicals so that an element included in the upper surface area 164P2 of the preliminary switch material pattern 160P2, for example, at least one of As, Se, S, and Te, may be volatilized or removed in an etching atmosphere. On the contrary, an internal area 162P2 of the preliminary switch material pattern 160P2 may not be exposed to the etching chemicals. Accordingly, at least one of As, Se, S, and Te included in the upper surface area 164P2 of the preliminary switch material pattern 160P2 may have the content profile ConP illustrated in FIG. 11.

Figure 18D:
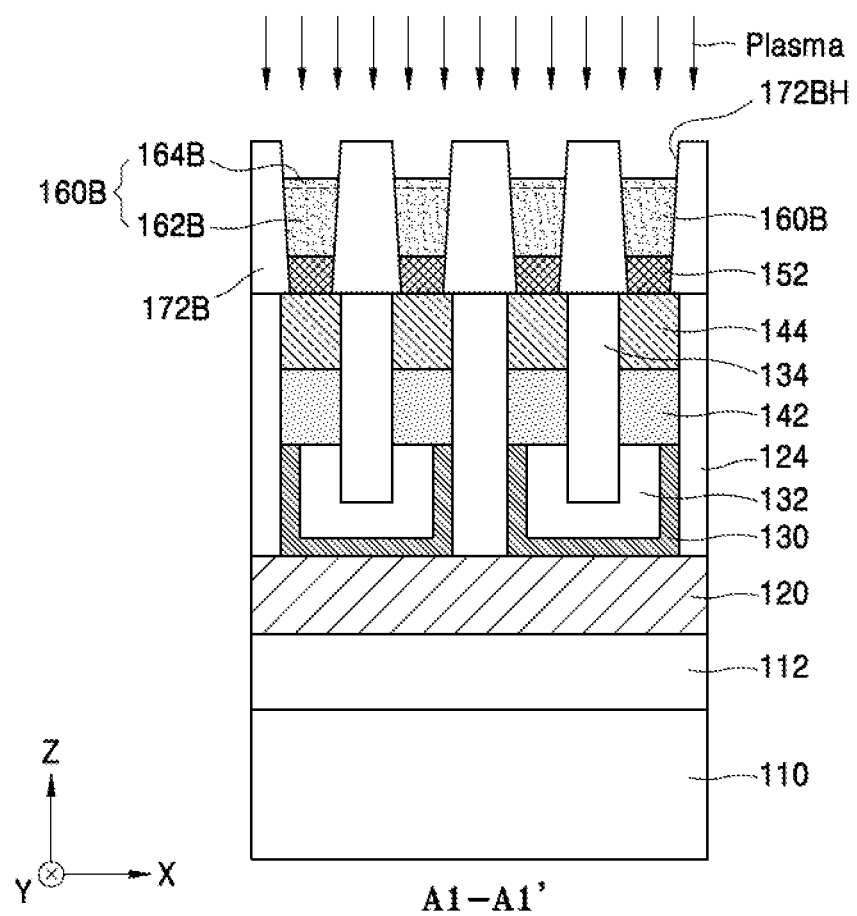

Referring to FIG. 18D, the switch material pattern 160B including the element injection area 164B may be formed by injecting at least one element from among As, Se, S, and Te into the upper surface area 164P2 of the preliminary switch material pattern 160P2 by performing a plasma treatment process on a structure in which the preliminary switch material pattern 160P2 (refer to FIG. 18C) is formed. An area of the switch material pattern 160B, in which the area is covered by the element injection area 164B, may be referred to as the internal area 162B, and the internal area 162B may not be affected by the plasma treatment process. At least one element from among As, Se, S, and Te included in the element injection area 164B may have the profile of the second content Con2 illustrated in FIG. 11 and the second content Con2 may be greater than the content profile ConP after the plasma treatment process. The technical characteristic of the plasma treatment process may be similar to that described above with reference to FIG. 16H.

According to an example embodiment of the present inventive concept, the switch material pattern 160B including the element injection area 164B may be formed by performing an ion implantation process similar to that described above with reference to FIG. 17B, rather than by performing a plasma treatment process. In this case, at least one element from among As, Se, S, and Te included in the element injection area 164B may have the profile of the second content Con2 illustrated in FIG. 12.

Figure 18E:
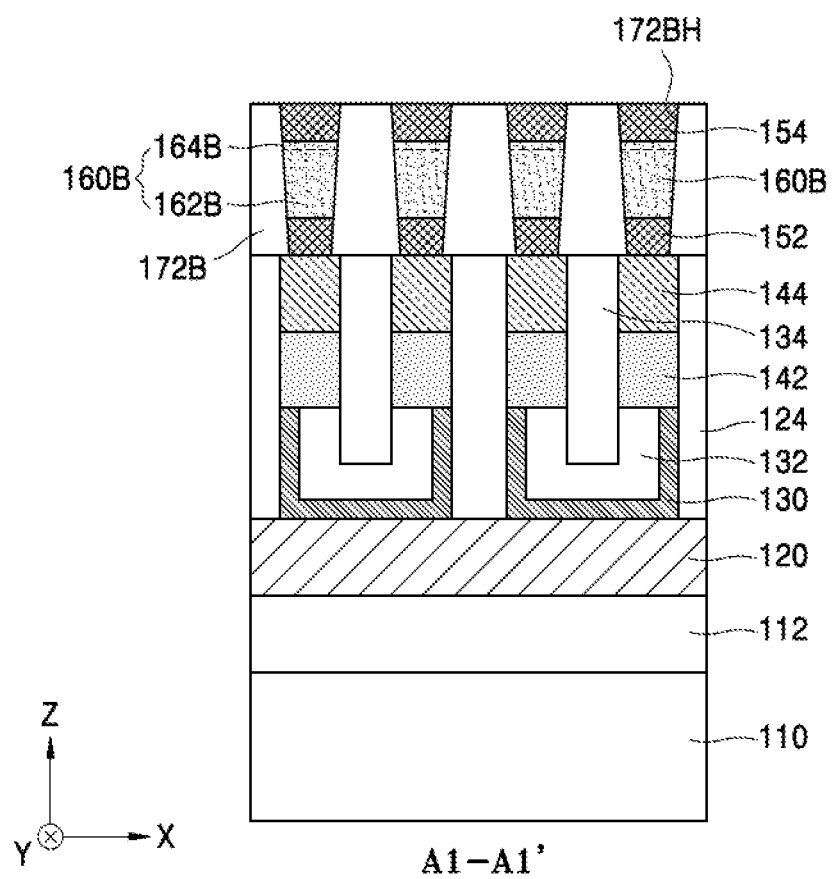

Referring to FIG. 18E, the second interface layer 154 filling the opening 172BH may be formed on the switch material pattern 160B.

Figure 18F:
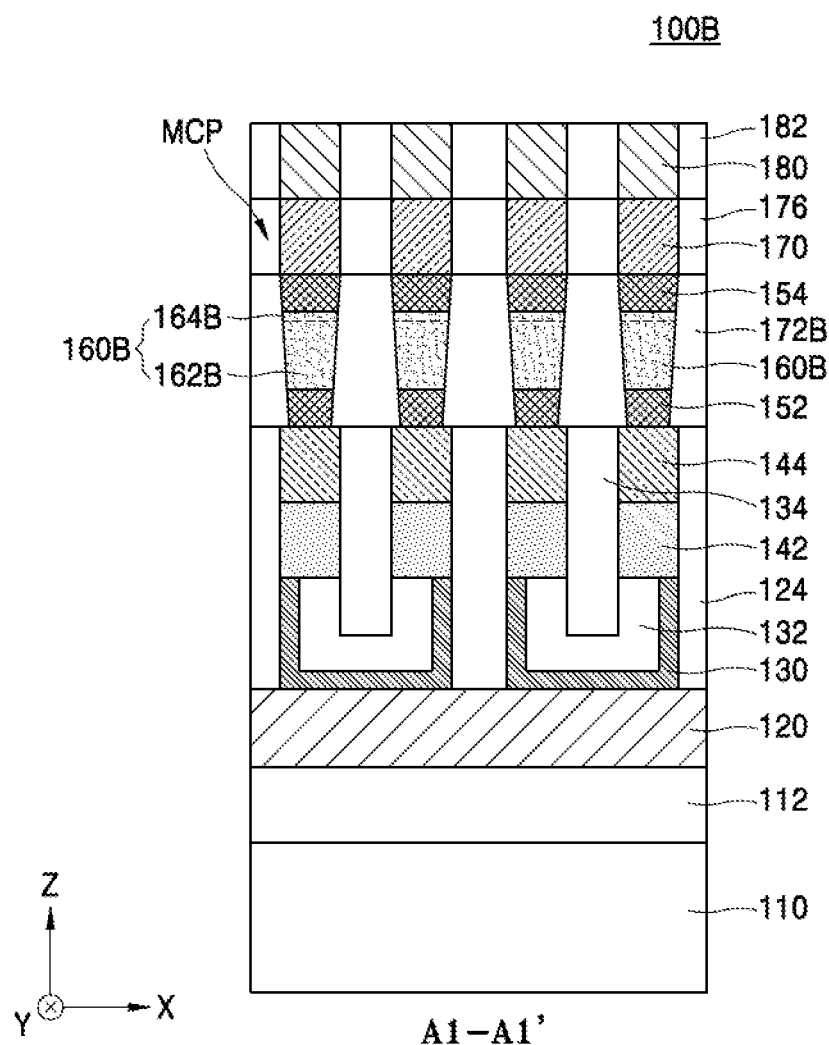

Referring to FIG. 18F, a conductive layer may be formed on the second interface layer 154 and the filling insulating layer 172B, and then the conductive layer may be patterned to form the upper electrode 170 on the second interface layer 154. Thereafter, an insulating layer covering the upper electrode 170 may be formed and an upper portion of the insulating layer may be planarized or etched back until an upper surface of the upper electrode 170 is exposed, to form the third insulating layer 176.

Thereafter, the memory device 100B may be manufactured by performing the processes described with reference to FIG. 16J. The plurality of second conductive lines 180 extending in the second direction (the Y direction) and the second insulating layer 182 filling spaces among the plurality of second conductive lines 180 may be formed on the upper electrode 170 and the third insulating layer 176.

According to the method of manufacturing the memory device 100B, the element injection area 164B may be formed on the upper surface portion of the switch material pattern 160B by performing the ion implantation process using at least one element from among As, Se, S, and Te after an etch back process for forming the switch material pattern 160B in the opening 172BH of the filling insulating layer 172. Since the at least one element from among As, Se, S, and Te may be re-supplied to the element injection area 164B by the ion implantation process, the loss of the at least one of As, Se, S, and Te may be compensated for. Thus, the memory device 100B may have excellent electrical characteristics and reliability.

While the present inventive concept has been particularly shown and described with reference to specific example embodiments thereof, it will be understood that various changes in form and details may be made therein without departing from the spirit and scope of the present inventive concept as defined by the appended claims.

What is claimed is:

1. A memory device comprising:
a plurality of first conductive lines extending on a substrate in a first direction that is parallel with an upper surface of the substrate;
a plurality of second conductive lines extending over the plurality of first conductive lines in a second direction that is parallel with the upper surface of the substrate; and
a plurality of memory cells arranged between the plurality of first conductive lines and the plurality of second conductive lines and each comprising a variable resistance memory layer and a switch material pattern,
wherein the switch material pattern comprises:
an element injection area arranged in an outer area of the switch material pattern, the outer area of the switch material pattern having an element injection distance from at least one side surface of the switch material pattern; and
an internal area surrounded by the element injection area,
wherein the internal area contains a first content of at least one element from among arsenic (As), sulfur (S), selenium (Se), and tellurium (Te),
the element injection area contains a second content of the at least one element from among As, S, Se, and Te,
a profile of the second content decreases from a position apart from the at least one side surface of the switch material pattern towards the internal area, and
a profile of the first content of the at least one element decreases from a center of the switching material pattern towards the element injection area.

2. The memory device of claim 1, wherein a maximum concentration of the second content is lower than a maximum concentration of the first content.

3. The memory device of claim 1, wherein, from a planar perspective, the element injection area covers an entirety of a side wall of the internal area, and
an upper surface of the element injection area is at a height the same as that of an upper surface of the internal area.

4. The memory device of claim 3, further comprising:
a first interface layer disposed between the switch material pattern and the variable resistance memory layer;
a second interface layer disposed between the switch material pattern and the plurality of second conductive lines; and
an upper electrode disposed between the second interface layer and the plurality of second conductive lines,
wherein side walls of the first interface layer, the switch material pattern, the second interface layer, and the upper electrode are collinearly aligned.

5. The memory device of claim 4, further comprising:
a filling insulating layer surrounding the side walls of the first interface layer, the switch material pattern, the second interface layer, and the upper electrode,
wherein an upper surface of the filling insulating layer is arranged at a height the same as that of an upper surface of the upper electrode.

6. The memory device of claim 5, further comprising:
an insulating spacer interposed between the filling insulating layer and the side walls of the first interface layer, the switch material pattern, the second interface layer, and the upper electrode,
wherein the element injection area is in contact with the insulating spacer.

7. The memory device of claim 1, wherein the internal area comprises $Ge_X As_Y Se_Z Si_U$ ($0<X+Y+Z+U\le1$),
the internal area contains a first As content of As and the element injection area contains a second As content of As which is lower than the first As content, and
the internal area contains a first Se content of Se and the element injection area contains a second Se content of Se which is lower than the first Se content.

8. The memory device of claim 7, wherein the second As content has a profile in which a content of As decreases from the position apart from the at least one side surface of the switch material pattern towards the internal area and
the second Se content has a profile in which a content of Se decreases from the position apart from the at least one side surface of the switch material pattern towards the internal area.

9. A memory device comprising:
a plurality of first conductive lines extending on a substrate in a first direction that is parallel with an upper surface of the substrate;
a plurality of second conductive lines extending over the plurality of first conductive lines in a second direction that is parallel with the upper surface of the substrate; and
a plurality of memory cells each arranged in an area in which one of the plurality of first conductive lines and one of the plurality of second conductive lines overlaps each other, between the plurality of first conductive lines and the plurality of second conductive lines, with each of the plurality of memory cells comprising a variable resistance memory layer and a switch material pattern,
wherein the switch material pattern comprises:
an internal area containing a first content of at least one element from among arsenic (As), sulfur (S), selenium (Se), and tellurium (Te); and
an element injection area surrounding of the internal area and containing a second content of the at least one element from among As, S, Se, and Te, a maximum concentration of the second content being lower than a maximum concentration of the first content,
wherein a profile of the second content decreases from a position apart from a side wall of the switch material pattern towards the internal area.

10. The memory device of claim 9, further comprising:
a first interface layer disposed between the switch material pattern and the variable resistance memory layer;
a second interface layer disposed between the switch material pattern and the plurality of second conductive lines; and
an upper electrode disposed between the second interface layer and the plurality of second conductive lines,
wherein side walls of the first interface layer, the switch material pattern, the second interface layer, and the upper electrode are collinearly aligned.

11. The memory device of claim 9, wherein, from a planar perspective, the element injection area covers an entirety of the side wall of the internal area, and
an upper surface of the element injection area is at a height the same as that of an upper surface of the internal area.

12. The memory device of claim 10, further comprising:
a filling insulating layer surrounding the side walls of the first interface layer, the switch material pattern, the second interface layer, and the upper electrode,
wherein a side wall of the element injection area is in contact with the filling insulating layer.

13. The memory device of claim 12, further comprising:
a filling insulating layer surrounding the side walls of the first interface layer, the switch material pattern, the second interface layer, and the upper electrode; and an insulating spacer interposed between the filling insulating layer and the side walls of the first interface layer, the switch material pattern, the second interface layer, and the upper electrode,
wherein a side wall of the element injection area is in contact with the insulating spacer.

14. A memory device comprising:
a plurality of first conductive lines extending on a substrate in a first direction that is parallel with an upper surface of the substrate;
a plurality of second conductive lines extending over the plurality of first conductive lines in a second direction that is parallel with the upper surface of the substrate; and
a plurality of memory cells each arranged in an area in which one of the plurality of first conductive lines and one of the plurality of second conductive lines overlaps each other, between the plurality of first conductive lines and the plurality of second conductive lines, with each of the plurality of memory cells comprising a variable resistance memory layer, a first interface layer, a switch material pattern, a second interface layer, and an upper electrode,
wherein the switch material pattern comprises:
an element injection area arranged in an outer area of the switch material pattern, the outer area of the switch material pattern having an element injection distance from at least one side surface of the switch material pattern; and
an internal area surrounded by the element injection area,
wherein the internal area contains a first content of at least one element from among arsenic (As), sulfur (S), selenium (Se), and tellurium (Te),
the element injection area contains a second content of the at least one element from among As, S, Se, and Te,
a maximum concentration of the second content is lower than a maximum concentration of the first content and a profile of the second content decreases from a position apart from the at least one side surface of the switch material pattern towards the internal area, and
side walls of the first interface layer, the switch material pattern, the second interface layer, and the upper electrode are collinearly aligned.

\* \* \* \* \*